US008704961B2

(12) United States Patent
Okita et al.

(10) Patent No.: US 8,704,961 B2
(45) Date of Patent: Apr. 22, 2014

(54) DISPLAY ELEMENT HAVING A LENS BEING FORMED AS PART OF A TRANSLUCENT SUPPORT SUBSTRATE HAVING A DISPLAY DISPOSED THEREON

(75) Inventors: Yoshitaka Okita, Osaka (JP); Hidekazu Takata, Osaka (JP); Masato Imanishi, Osaka (JP); Kazuya Fujita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 633 days.

(21) Appl. No.: 12/462,525

(22) Filed: Aug. 5, 2009

(65) Prior Publication Data
US 2010/0033647 A1 Feb. 11, 2010

(30) Foreign Application Priority Data

Aug. 8, 2008 (JP) ................................. 2008-206440

(51) Int. Cl.
| G02F 1/13 | (2006.01) |
| G02F 1/1333 | (2006.01) |
| G02F 1/1345 | (2006.01) |
| G03B 17/18 | (2006.01) |
| G03B 13/02 | (2006.01) |
| G03B 29/00 | (2006.01) |
| G03B 17/00 | (2006.01) |
| G03B 17/02 | (2006.01) |

(52) U.S. Cl.
USPC ............... 349/2; 349/111; 349/149; 396/287; 396/374; 396/429; 396/529; 396/535

(58) Field of Classification Search
USPC .............. 349/149, 151, 152, 2, 110; 396/287, 396/374, 429, 529, 535
See application file for complete search history.

(56) References Cited

U.S. PATENT DOCUMENTS

2007/0047938 A1* 3/2007 Suzuki et al. .................... 396/89

FOREIGN PATENT DOCUMENTS

| JP | 05-014880 | * | 1/1993 | ......................... 7/14 |
| JP | 05-014880 | A | 1/1993 | |
| JP | 09-244007 | A | 9/1997 | |
| JP | 11-317894 | * | 11/1999 | ......................... 5/335 |

* cited by examiner

Primary Examiner — Lauren Nguyen
(74) Attorney, Agent, or Firm — Edwards Wildman Palmer LLP; David G. Conlin; David A. Tucker

(57) ABSTRACT

A display element and electronic element module according to the present invention is described, in which a lens is formed as part of a translucent support substrate having a display disposed thereon, the lens being formed on a part other than where the display is disposed, where an electronic element is disposed for the lens.

49 Claims, 19 Drawing Sheets

DISPLAY ELEMENT HAVING A LENS BEING FORMED AS PART OF A TRANSLUCENT SUPPORT SUBSTRATE HAVING A DISPLAY DISPOSED THEREON

This nonprovisional application claims priority under 35 U.S.C. §119(a) to Patent Application No. 2008-206440 filed in Japan on Aug. 8, 2008, the entire contents of which are hereby incorporated by reference.

BACKGROUND OF THE INVENTION

1. Field of the Invention

The present invention relates to a display element and electronic element module, such as a display module with an integrated light receiving element, in which an image capturing element is integrated with a glass substrate functioning as a transparent support substrate having a display element disposed thereon, the image capturing element being configured with a semiconductor element for performing a photoelectric conversion on and capturing an image from an image light from a subject; and a method for manufacturing the display element and electronic element module. Furthermore, the present invention relates to an electronic information device, such as a digital camera (e.g., a digital video camera and a digital still camera), an image input camera, a scanner, a facsimile machine, and a camera-equipped cell phone device, a television telephone device, and a display module equipped with a television set and a display unit or a display apparatus for displaying information, having the display element and electronic element module used in a display section and a light receiving section thereof.

2. Description of the Related Art

A conventional liquid crystal display element, a conventional solid-state image capturing element, and simplification of connecting wirings with a plurality of electronic parts for driving them and processing signals will be described in detail, as References 1 and 2, with reference to FIGS. 43 to 46.

FIG. 43 is a perspective view illustrating a conventional liquid crystal display apparatus and a resin substrate for connecting the liquid crystal display apparatus.

In FIG. 43, a liquid crystal display element 100 and a connector connecting section 101 are coupled with each other by being bent by a flexible wiring substrate 102. The connector connecting section 101 is inserted in a connector 103 and is connected to a printed wiring of a resin substrate 104 via the connector 103. The connector 103 and a plurality of electronic parts 105 are installed on the resin substrate 104 and are connected to the printed wiring. In addition, a drive IC 106 is installed on the flexible wiring substrate 102 using a TCP bonding method to control the driving of the liquid crystal display element 100.

Thus, the liquid crystal display element 100 and the resin substrate 104 are formed separately and they are connected to each other by the connector connecting section 101 and the connector 103. As a result, the number of parts has increased and the size has become large. In order to solve these problems, FIG. 44 illustrates an example where the liquid crystal display element and a conductive pattern are formed on the same glass substrate and electronic parts for the driving and the like are installed on the conductive pattern.

FIG. 44 is a cross sectional view of a conventional liquid crystal display apparatus and a plurality of electronic parts installed on the same resin substrate.

In FIG. 44, a conductive pattern 201a is formed on a side of a glass substrate 200 to connect conductive patterns 201 on both of the upper and lower sides of the glass substrate 200. A liquid crystal display element 202 is disposed on the glass substrate 200, and a light emitting section 203 is disposed on the opposite surface of the glass substrate 200, the light emitting section 203 being a backlight for illuminating light on the liquid crystal display element 202.

Thus, the liquid crystal display element 202 and the conductive pattern 201 are formed on the same glass substrate 200 and electronic parts 204 for the driving and the like are installed on the conductive pattern 201, so that the number of parts used as a connecting wiring section can be reduced and downsizing can be achieved, compared to the conventional case in FIG. 43. In particular, the conductive pattern 201 and an electrode of the liquid crystal display element 202 are directly connected with each other, so that the connector 103 in FIG. 43 is no longer required. As a result, work including assembling, connecting and wiring is not required and the number of parts are further reduced.

Furthermore, the same applies to the case where a CCD image capturing element is used instead of the liquid crystal display element 202. FIG. 45 illustrates such a case.

FIG. 45 is a cross sectional view illustrating the case where a conventional CCD image capturing element and a plurality of electronic parts are installed on the same resin substrate.

FIG. 45 illustrates an example of a multilayered structure in which a laminate plate 300a is laminated on a glass substrate 300 using a through hole glass press substrate. A CCD image capturing element 301 is installed on the glass substrate 300 and a conductive pattern 302, with which the CCD image capturing element 301 is connected, is further provided. Electronic parts 303 and an IC 303a are installed on the conductive pattern 302 of the laminate plate 300a. The conductive patterns 302 on both front and back surfaces of the glass substrate 300 are connected to each other by a through hole 304.

On the other hand, in a recent mobile terminal, such as a camera-equipped cell phone device, various semiconductor apparatuses are connected via a CPU (central processing unit) of the cell phone device. The various semiconductor apparatuses include a camera module with an image capturing element, such as a CMOS sensor and a CCD sensor, and a lens built therein; and a liquid crystal panel module (or an organic EL panel) functioning as a display apparatus. In particular, in a folding-type cell phone device, since signals are transferred from a display surface side terminal to a body side terminal disposed with a CPU (central processing unit), it is necessary to wire signal lines to a folding hinge section via an FPC (Flexible Printed Circuit) and the like. When a camera module is disposed in the display surface side terminal, an FPC wiring of the camera module is also required in addition to an FPC wiring for a liquid crystal panel module (or organic EL panel), thereby increasing the area and the cost required for the wiring.

Further, it is feared that the increase in the number of parts will extend the development period TAT on the terminal manufacturing side, and the customizing of the FPC wiring is required for every terminal type on the camera module manufacturing side, which will extend the development period TAT.

In order to solve the problem, Reference 2 proposes a structure in which an image capturing element is integrated with a glass substrate having a display element disposed thereon.

FIG. 46 is a plan view illustrating a conventional integrated structure of a display element and an image capturing element, which is disclosed in Reference 2.

In a conventional television telephone apparatus as illustrated in FIG. 46, an image display element 401 is disposed at a center portion of a translucent support substrate 400 and a solid-state image capturing element 402 and a driving semiconductor element 403, such as a driver, are disposed in the periphery of the image display element 401 in order to fix vision of callers.

Reference 1: Japanese Laid-Open Publication No. 9-244007

Reference 2: Japanese Laid-Open Publication No. 5-14880

SUMMARY OF THE INVENTION

Even in the conventional integrated structure of a display element and an image capturing element disclosed in Reference 2 described above, it is not possible to achieve a further reduction of the number of parts, a reduction of the installing area, downsizing and thinning of the terminal by the improvement of the wiring efficiency, or lowering of the power consumption.

The present invention is intended to solve the conventional problems described above. The objective of the present invention is to provide a display element and electronic element module, such as an image capturing element with an integrated display element, which has a structure, in which an image capturing element and even a lens are integrated on a glass substrate having a display element disposed thereon, so as to achieve a further reduction of the number of parts, a reduction of the installing area, downsizing and thinning of the terminal by the improvement of the wiring efficiency, and lowering of the power consumption; a method for manufacturing the display element and electronic element module; and an electronic information device, such as a camera-equipped cell phone device, having the display element and electronic element module used in a display section and a light receiving section thereof.

A display element and electronic element module according to the present invention is provided, in which a lens is formed as part of a translucent support substrate having a display disposed thereon, the lens being formed on a part other than where the display is disposed, wherein an electronic element is disposed for the lens, thereby achieving the objective described above.

Preferably, in a display element and electronic element module according to the present invention, a shielding layer is provided on an outer circumference side of the lens formed on the translucent support substrate.

Still preferably, in a display element and electronic element module according to the present invention, a shielding film is provided on the translucent support substrate surrounded by the shielding layer, except for on a middle portion for receiving incident light for the lens.

Still preferably, in a display element and electronic element module according to the present invention, the shielding layer is a groove formed on the translucent support substrate, filled with a shielding material.

Still preferably, in a display element and electronic element module according to the present invention, the shielding layer is a plurality of grooves formed in the translucent support substrate, filled with a shielding material, the plurality of grooves being formed double or triple in a circular, ellipse or quadrilateral shape in a plan view.

Still preferably, in a display element and electronic element module according to the present invention, one of the double shielding layers is a groove formed from one surface side of the translucent support substrate, filled with a shielding material, and the other one of the double shielding layers is a groove formed from the other surface side of the translucent support substrate, filled with a shielding material.

Still preferably, in a display element and electronic element module according to the present invention, a metal film for wiring is provided on a metal film for shielding a light with an insulation film interposed therebetween, and each terminal section of the electronic element is connected to a wiring layer in which the metal film for wiring is patterned.

Still preferably, in a display element and electronic element module according to the present invention, a space between the electronic element and the translucent support substrate is sealed with a shielding material.

Still preferably, in a display element and electronic element module according to the present invention, in order to directly display an image on the display based on image data from an image capturing element as the electronic element, a wiring path is provided, in which the display is connected with the image capturing element by a wiring pattern of a metal film on the translucent support substrate.

Still preferably, in a display element and electronic element module according to the present invention, an IR cut material is provided between the lens and a light receiving area of a light receiving element as the electronic element.

Still preferably, in a display element and electronic element module according to the present invention, the IR cut material is provided on any of: a curved surface of the lens, a surface of a translucent support substrate surface opposite from a side on which the curved surface of the lens is formed, and a surface of the light receiving area of the light receiving element.

Still preferably, in a display element and electronic element module according to the present invention, the lens of the translucent support substrate is either a concave lens or a convex lens.

Still preferably, in a display element and electronic element module according to the present invention, one or a plurality of electrode sections are disposed in a peripheral area surrounding an element area in the electronic element, and a connection configuration, in which the electronic element is connected to a wiring section of the translucent support substrate configuring a display by a conductive protrusion on the electrode section, includes a packaging configuration, in which at least the connection configuration is bonded with a resin between the translucent support substrate and the electronic element in such a manner to avoid an area corresponding to the element area between the translucent support substrate and the electronic element.

Still preferably, in a display element and electronic element module according to the present invention, a connection section, in which conductive particles of an anisotropy conductive resin material are interposed between the wiring section of the translucent support substrate and the conductive protrusion on the electrode section, is bonded with the resin in such a manner to completely cover the connection section.

Still preferably, in a display element and electronic element module according to the present invention, the peripheral area including the connection configuration between the translucent support substrate and the electronic element is bonded with the resin.

Still preferably, in a display element and electronic element module according to the present invention, a protruded step section for preventing the resin from spreading into an area corresponding to the element area is provided in at least either the peripheral area of the electronic element or an area of the translucent support substrate facing the peripheral area.

Still preferably, in a display element and electronic element module according to the present invention, a protruded step section for preventing the resin from spreading outside is provided in at least either a peripheral section of the electronic element or a peripheral section of the area facing the electronic element on the translucent support substrate.

Still preferably, in a display element and electronic element module according to the present invention, a material having a characteristic of repelling the resin is provided in at least either the peripheral area of the electronic element or an area of the translucent support substrate facing the peripheral area, to prevent the resin from spreading in the area corresponding to the element area.

Still preferably, in a display element and electronic element module according to the present invention, a material having a characteristic of repelling the resin is provided in at least either the peripheral area of the electronic element or a peripheral section of an area on the translucent support substrate facing the electronic element, to prevent the resin from spreading outside.

Still preferably, in a display element and electronic element module according to the present invention, the peripheral section of the electronic element is an end section of the electronic element and the periphery of the exterior side.

Still preferably, in a display element and electronic element module according to the present invention, a sealing resin is provided further at a peripheral section of the periphery of the exterior side, and the sealing resin seals a space between the translucent support substrate and the electronic element.

Still preferably, in a display element and electronic element module according to the present invention, the sealing resin covers a side surface and an upper surface of the electronic element.

Still preferably, in a display element and electronic element module according to the present invention, at least a surface section of the protruded step section is formed of a material having a characteristic of repelling the resin.

Still preferably, in a display element and electronic element module according to the present invention, as the resin, a resin including conductive particles is provided at least at a connection section of the connecting configuration.

Still preferably, in a display element and electronic element module according to the present invention, the resin material includes conductive particles and is an anisotropy conductive resin material.

Still preferably, in a display element and electronic element module according to the present invention, the resin at least partially includes a resin including non-conductive particles.

Still preferably, in a display element and electronic element module according to the present invention, the resin at least partially includes a light shielding resin. The resin includes a sealing resin. At least a part of the sealing resin may include a light shielding resin. However, as is often the case, a light shielding resin is difficult to cure by ultraviolet rays. In such a case, it is not recommended to allow the resin to have a light shielding characteristic.

Still preferably, in a display element and electronic element module according to the present invention, the step section is formed of a common material for forming the display.

Still preferably, in a display element and electronic element module according to the present invention, the material repelling the resin is formed of a common material for forming the display.

Still preferably, in a display element and electronic element module according to the present invention, the step section is formed of a common material for forming a film on the electronic element.

Still preferably, in a display element and electronic element module according to the present invention, the step section is formed of a material that cures by electromagnetic waves.

Still preferably, in a display element and electronic element module according to the present invention, the translucent support substrate includes wirings on both surfaces, which are connected by a through hole and/or a side surface wiring.

Still preferably, in a display element and electronic element module according to the present invention, the electronic element is disposed on a surface opposite from a surface, on which the display is disposed, of the translucent support substrate, and the display and the electronic element area are electrically connected with each other by the wirings on both surfaces.

Still preferably, in a display element and electronic element module according to the present invention, the electronic element is a light receiving element.

Still preferably, in a display element and electronic element module according to the present invention, the electronic element is an image capturing element including a plurality of light receiving sections provided therein for performing a photoelectric conversion on incident light to capture an image.

Still preferably, in a display element and electronic element module according to the present invention, the translucent support substrate is either a glass substrate or a resin substrate.

A method for manufacturing the display element and electronic element module according to the present invention is provided, the method comprising: a lens forming step of forming the lens on a part of the translucent support substrate having the display disposed thereon, the lens being formed on a part other than where the display is disposed; and an electronic element disposing step of disposing the electronic element for the lens, thereby achieving the objective described above.

Preferably, in a method for manufacturing the display element and electronic element module according to the present invention, in the lens forming step, a resist film surface shape obtained by heat-treating a patterned resist film is either transferred to the translucent support substrate by etching, or pressed on the translucent support substrate by a high temperature stamper, to form the lens surface.

Still preferably, in a method for manufacturing the display element and electronic element module according to the present invention, in the lens forming step, one or a plurality of lenses are fixed in such a manner to correspond to the lens formed from the translucent support substrate, the one or plurality of lenses being maintained in a holder.

An electronic information device according to the present invention includes the display element and electronic element module according to the present invention used in a display section and an image capturing section thereof, thereby achieving the objective described above.

An electronic information device according to the present invention includes the display element and electronic element module according to the present invention used in a display section, a light emitting section and a light receiving section thereof, thereby achieving the objective described above.

The functions of the present invention having the structures described above will be described hereinafter.

In the present invention, a lens is formed on a part of a translucent support substrate other than a portion where a display is disposed, and an electronic element is disposed for the lens. Thus, the structure is such that an electronic element (an image capturing element) and further a lens are integrated with a translucent support substrate, such as a glass substrate, having a display (a display element) disposed thereon. As a result, it becomes further possible to achieve a reduction of the number of parts, a reduction of the installing area, downsizing and thinning of the terminal by the improvement of the wiring efficiency, and lowering of the power consumption.

According to the present invention with the structure described above, the structure is such that a light receiving section is integrated with a glass substrate having a display element disposed thereon, and a lens used for a light receiving section is formed from a part of the glass substrate, so that it becomes further possible to achieve a reduction of the number of parts, a reduction of the installing area, downsizing and thinning of the terminal by the improvement of the wiring efficiency, lowering of the power consumption, and a cost reduction.

These and other advantages of the present invention will become apparent to those skilled in the art upon reading and understanding the following detailed description with reference to the accompanying figures.

Figure 1:
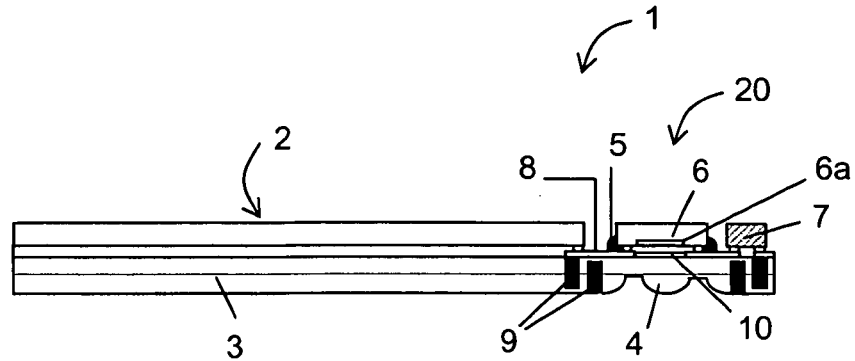
FIG. 1 is a longitudinal cross sectional view illustrating an exemplary essential structure of a display element and electronic element module according to Embodiment 1 of the present invention.

1, 1A display element and image capturing element module
2 display apparatus
3 glass substrate
4 lens
4a lens shape of a convex lens
41 concave lens
42 lens shape of a Fresnel lens
5 shielding material
6 image capturing element
6a light receiving surface
7 group of other elements
8 three layers of metal multilayered film
8a metal thin film for shielding
8b insulation film
8c metal thin film for wiring
9 lens shielding layer
9a groove
9b shallow lens shielding layer
10 IR cut material
11, 12, 13 resist film
11a circular segment pattern for forming a shielding layer
12a, 13a circular segment pattern for forming a lens
14 high temperature stamper
15, 16 resist pattern
15a part where an IR cut material is removed
16a resist rectangular pattern
17A, 18A group of two lenses
18B shielding member (shielding holder)
20, 20A-20D image capturing element module
51 liquid crystal display module with an integrated light receiving section (display element and image capturing element module)
52 liquid crystal display
53 translucent support substrate
54 electrode pad
55 light receiving element chip
56a land section
56b wiring section
57, 57A conductive protrusion
58 conductive particles
59, 59A-59C resin (adhesive resin)
60 light receiving area
61 lens unit
64 insulation film
65 microscopic lens
66 cover film
71-74 step section
90 electronic information device
91 solid-state image capturing apparatus
92 memory section
93 display section
94 communication section
95 image output section

DESCRIPTION OF THE PREFERRED EMBODIMENTS

Hereinafter, as Embodiments 1 to 3 of a display element and electronic element module and a method for manufacturing the display element and electronic element module according to the present invention, a display element and image capturing element module, such as a liquid crystal display module with an integrated light receiving section, and a method for manufacturing thereof will be described in detail with reference to accompanying figures; and as Embodiment 4, an electronic information device, such as a camera-equipped cell phone device, having the display element and electronic element module used in a display section and an image capturing section, as a light receiving section thereof, will be described in detail with reference to accompanying figures.

(Embodiment 1)

Figure 2:
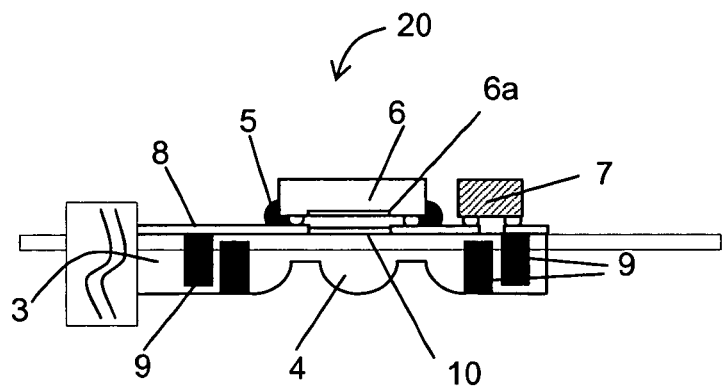
FIG. 2 is an enlarged cross sectional view of an image capturing element portion of FIG. 1.

FIG. 1 is a longitudinal cross sectional view illustrating an exemplary essential structure of a display element and electronic element module according to Embodiment 1 of the present invention. FIG. 2 is an enlarged cross sectional view of an image capturing element portion of FIG. 1.

In FIGS. 1 and 2, a display element and image capturing element module 1 according to Embodiment 1 is an image capturing element with an integrated display element (a display module with an integrated light receiving element). The display element and image capturing element module 1 includes: a display apparatus 2 disposed on a glass substrate 3; a lens 4 having a curved surface on a surface opposite from a surface with the display apparatus 2; lens shielding layers 9 and 9 having a double circular shape in a plan view, for shielding an outer circumference side of the lens 4 in a plan view; an image capturing element 6 disposed by sealing the periphery of a chip by a shielding material 5 while a light receiving surface 6a is facing the same surface as a disposing surface of the display apparatus 2 with respect to the lens 4; and a group of other elements 7, which are various electronic members such as a driver. An image capturing element module 20 is configured of the lens 4, the shielding material 5, the image capturing element 6 and the lens shielding layers 9 and 9, other than the display apparatus 2.

That is, the display apparatus 2 (for example, a liquid crystal panel or an organic EL panel or the like, as a display element) is disposed on the glass substrate 3, and the lens 4 is formed from a part of the glass substrate 3 in the periphery of the display apparatus 2. On a surface of a glass substrate 3 opposite from the surface on which the lens 4 is formed, the image capturing element 6 is disposed corresponding to the position of the lens 4, and the periphery of the image capturing element 6 is sealed by the shielding material 5. Together with the group of other elements 7, the image capturing element 6 is wired by a metal thin film 8 (metal wiring pattern), which has a light shielding characteristic and will be later described, such as aluminum. Electronic parts, such as a controller and a drier for driving the display apparatus 2 and an image processing element, can be listed as the group of the other elements 7, and the group of the other elements 7 may be disposed on the outside of the glass substrate 3.

Figure 3:
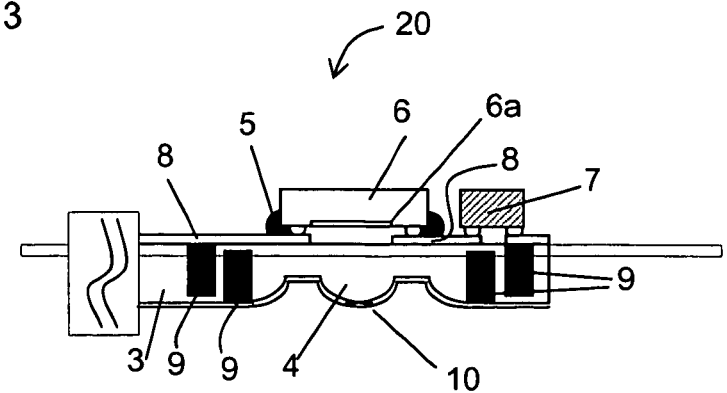
FIG. 3 is an essential part cross sectional view of an image capturing element portion illustrating an exemplary structure of the case where an IR cut material for cutting a wavelength of an unnecessary infrared ray area, is formed on a lens surface.
Figure 4:
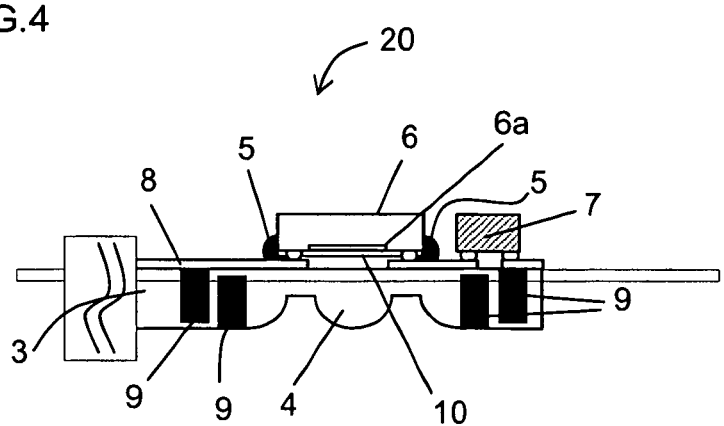
FIG. 4 is an essential part cross sectional view of an image capturing element portion illustrating an exemplary structure of the case where an IR cut material for cutting a wavelength of an unnecessary infrared ray area, is directly formed on a surface of an image capturing element.

Additionally, an IR cut material 10 for cutting unnecessary wavelengths in an infrared red area from incident light may be disposed in the front of the light receiving surface 6a of the image capturing element 6. In FIGS. 1 and 2, the IR cut material 10 is coated thin on a surface opposite from the surface, on which the lens 4 is formed, of the glass substrate 3. Without the limitation to this, as illustrated in FIG. 3, the side of the surface on which the lens is formed may be coated thin with the IR cut material 10. As illustrated in FIG. 4, the IR cut material 10 may be coated thin directly on the light receiving part 6a of the image capturing element 6 (CMOS sensor or CCD sensor).

Hereinafter, a method for manufacturing the image capturing element module 20 having the structure described above will be described.

Figure 5:
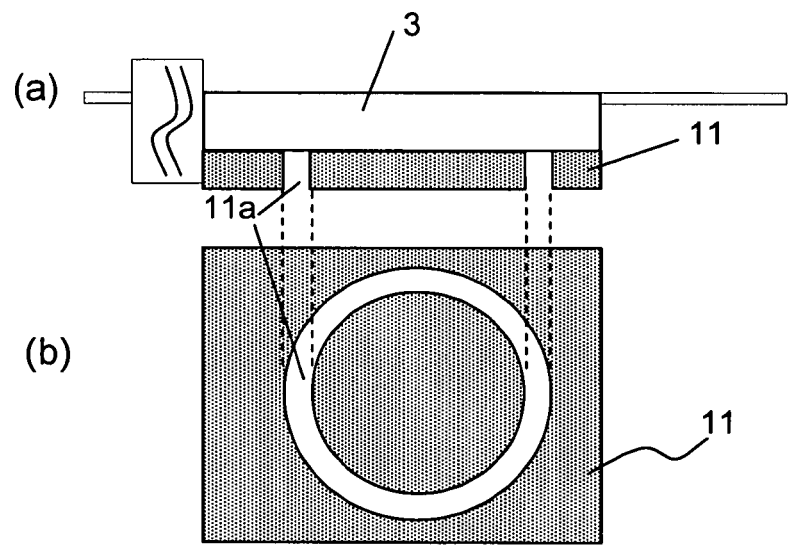
FIG. 5(a) is an essential part cross sectional view illustrating an exemplary pattern of a resist material for forming a lens shielding layer of FIG. 1 on a glass substrate.
FIG. 5(b) is a back surface view of the structure of FIG. 5(a).
Figure 6:
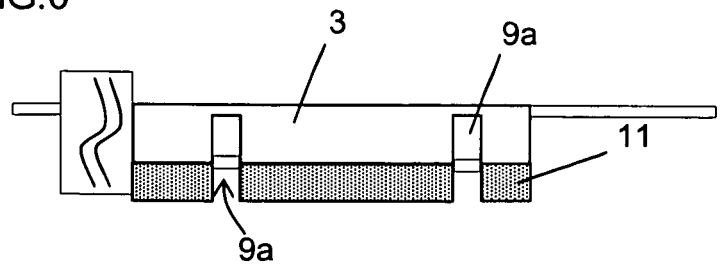
FIG. 6 is an essential part cross sectional view illustrating a step of forming a groove in a glass substrate by performing anisotropy etching on the glass substrate with the resist material of FIG. 5 as a mask.

First, a forming step of a lens shielding layer 9 will be described. As illustrated in FIG. 5, the forming step of the lens shielding layer 9 includes: forming a resist material on one surface (a lens forming surface on which a lens is later formed) of the glass substrate 3 and forming a circular segment pattern 11a (a resist pattern in which a resist is peeled off in the circular segment part; it may be an ellipse segment pattern) for forming a shielding layer on the resist material, to be defined as a resist film 11; and subsequently, performing anisotropy etching by RIE (Reactive Ion Etching) and the like with the resist film 11 having the circular segment pattern 11a of the resist pattern formed therein as a mask, so as to form a groove 9a for shielding light in the glass substrate 3 as illustrated in FIG. 6. A novolac polymer or a styrene polymer is used for the resist material. The styrene polymer has a good transparency, and it is also used for a microlens of an image sensor. The anisotropy etching includes glass etching by dry etching with $CHF_3$ (trifluoromethane) gas.

Figure 7:
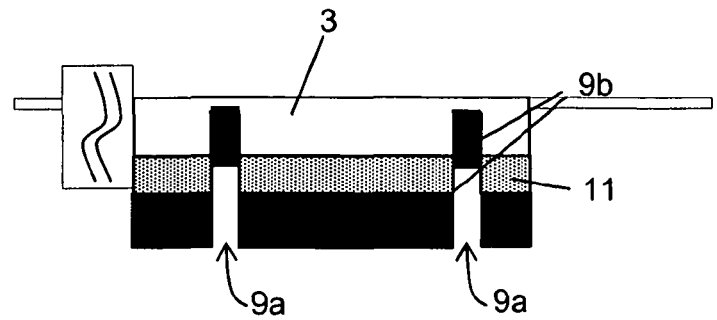
FIG. 7 is an essential part cross sectional view illustrating a step of filling the groove of the glass substrate of FIG. 6 with a light shielding material.

Subsequently, as illustrated in FIG. 7, the groove 9a for shielding light is filled with a shielding material 9b in the glass substrate 3. Here, vapor deposition, for example, can be listed as a method for filing the groove 9a for shielding light with the shielding material 9b; however, without the limitation to this, any method can be used as long as the groove 9a for shielding light is either filled or coated with the shielding material 9b.

Figure 8:
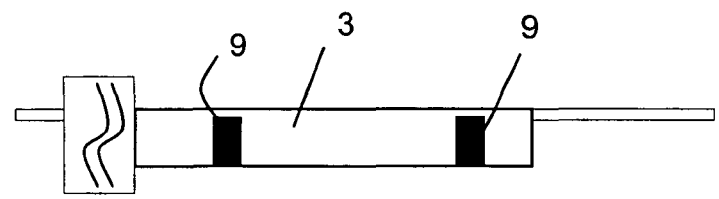
FIG. 8 is an essential part cross sectional view illustrating an internal lens shielding layer, which is formed by removing unnecessary resist material and excess shielding material.

Further, unnecessary resist material is dissolved by a resist removing solution, such as acetone and a sulfuric acid hydrogen peroxide mixture, to remove the resist film 11, and further, an unnecessary shielding material 9b is removed by a polishing method, such as CMP (Chemical Mechanical Polishing) and a surface on which the lens shielding layer 9 is planarized, so that the lens shielding layer 9 having a circular shape in a plan view can be obtained as illustrated in FIG. 8.

Figure 9:
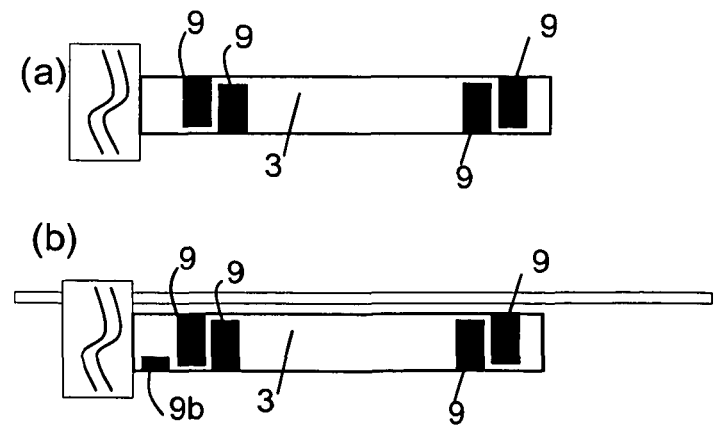
FIG. 9(a) is an essential part cross sectional view of the case where an external lens shielding layer larger than the lens shielding layer of FIG. 8 is formed from the surface opposite from the lens shielding layer forming surface.
FIG. 9(b) is an essential part cross sectional view illustrating an exemplary variation of FIG. 9(a).

Using the same method as described above, a lens shielding layer 9 of a circular shape in a plan view, whose diameter is a size larger than that of the lens shielding layer 9 described with reference to FIG. 8, is formed on a surface (on which an image capturing element will be disposed later) opposite from the surface on which the lens shielding layer 9 is formed, as illustrated in FIG. 9(a). Here, the space between the interior lens shielding layer 9 and the exterior lens shielding layer 9 of a circular or ellipse shape in a plan view may be formed with an optimum condition in view of light shielding efficiency, glass substrate strength and the like.

Figure 10:
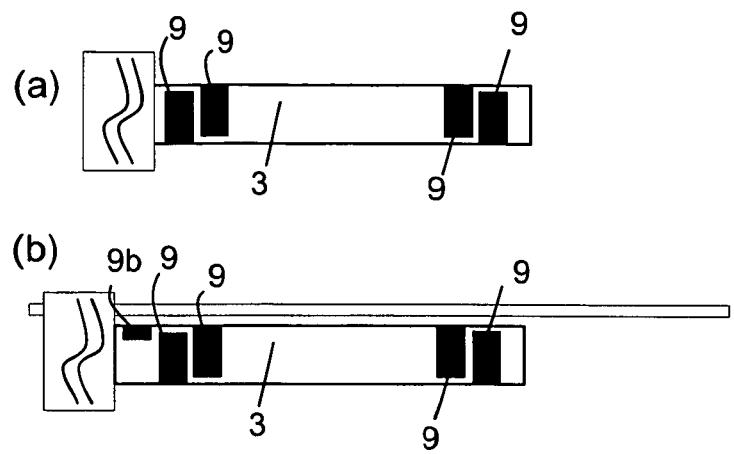
FIG. 10(a) is an essential part cross sectional view of the case where the internal lens shielding layer and the external lens shielding layer of FIG. 9 are replaced.
FIG. 10(b) is an essential part cross sectional view illustrating an exemplary variation of FIG. 10(a).

In addition, on the lower left side of FIG. 9(a) of the double lens shielding layers 9 and 9, a backlight for displaying a liquid crystal (not shown) is disposed, and it is necessary to shield light from the backlight in a further definite manner. Therefore, as illustrated in FIG. 9(b), a lens shielding layer 9b of a circular or ellipse shape in a plan view, which is shallow and does not affect the strength of the glass substrate 3, is provided on a further exterior side to cover a space of the exterior lens shielding layer 9. In addition, as illustrated in FIG. 10(a), it is also possible to switch the interior lens shielding layer 9 to the exterior side and the exterior lens shielding layer 9 to the interior side to be disposed. When the lens shielding layer 9b, which is shallower than the exterior lens shielding layer 9, is provided, it is provided from the surface opposite from the surface on which the curved surface of the lens is formed in order to cover a space of the exterior lens shielding layer 9 as illustrated in FIG. 10(b).

Figure 11:
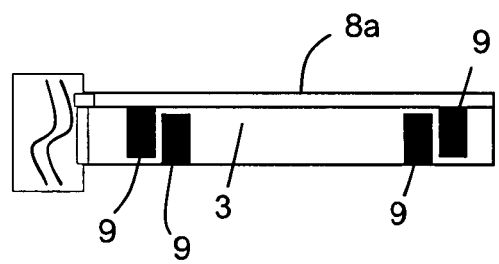
FIG. 11 is an essential part cross sectional view of the case where a metal thin film is formed on a surface opposite from the lens forming surface of FIG. 1.

Further, a metal thin film 8a (not shown) is formed on the glass substrate 3 on the surface side, on which the exterior lens shielding layer 9 is formed, for shielding light, to cover at least the interior of the exterior lens shielding layer 9 of a circular or ellipse shape as illustrated in FIG. 11. As a result, the glass substrate 3, in which the interior and the exterior of the double lens shielding layers 9 and 9 and the metal thin film 8a are formed, is obtained. The forming method and the shape of the double lens shielding layers 9 and 9 are not limited to the above described ones with the circular shape in a plan view as described above; however, any method and shape (a rectangular or square shape in a plan view, for example) can be used as long as incident light from the outer circumference of the lens, and particularly, the light from the backlight from the lower left side, can be prevented. Note that the lens shielding layers 9 and 9 are integrated and described as the lens shielding layers 9 in the following description, unless the interior lens shielding layer 9 and the exterior lens shielding layer 9 are distinguished from each other.

Figure 12:
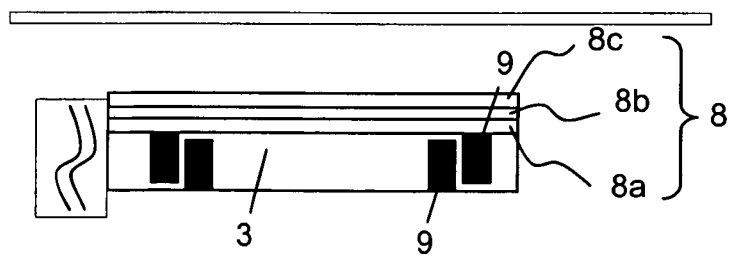
FIG. 12 is an essential part cross sectional view illustrating that the metal thin film of FIG. 11 is configured of a multi-layered metal film.

In addition, it is possible to form the metal thin film 8a for shielding light on the glass substrate 3 right before a step when a patterning of a metal thin film 8c for wiring via an insulation film 8b there above is necessary. If the metal thin film 8a is first formed, a step to protect the metal thin film 8a from heat and chemical fluids will be necessary in the following steps. Therefore, it is desirable to perform the formation of the metal thin film 8a right before the step when the patterning of a metal thin film 8c there above is necessary. However, for convenience' sake, the case where only the metal thin film 8a is first formed is described herein. Although in a step where the metal thin film 8a needs to be protected, the description for the protection will be omitted herein. In an actual step, the protection of the metal thin film 8a may be performed in accordance with its necessity. In FIG. 12, the film thickness of the three layers of a metal multilayered film 8, which includes the metal thin film 8a, the insulation film 8b and the metal thin film 8c, is shown thick to simplify the description; however, the film thickness of the metal thin film 8a in FIG. 11 and that of the metal multilayered film 8 in FIG. 12 are, in reality, of comparable thickness.

Figure 13:
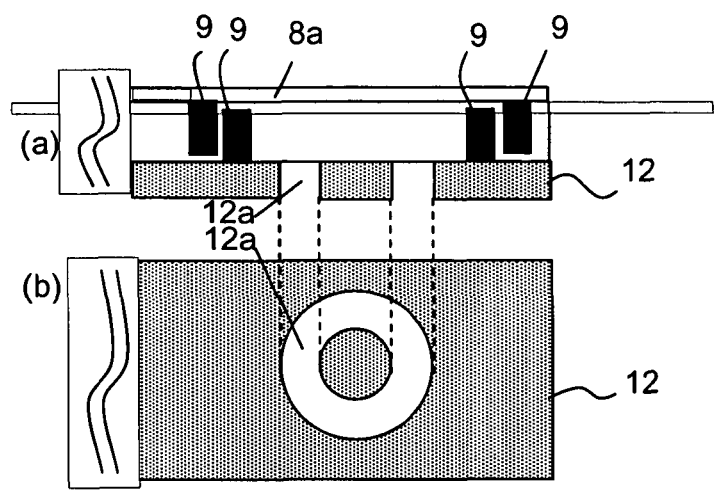
FIG. 13(a) is an essential part cross sectional view illustrating an exemplary pattern of a resist material for forming a convex lens on the glass substrate of FIG. 1.
FIG. 13(b) is a back surface view of the structure of FIG. 13(a).

Next, a lens forming step of forming a curved surface shaped lens on one surface of the glass substrate 3 will be described. This lens forming step will be described with regard to the case with the lens 4, a convex lens. As illustrated in FIGS. 13(a) and 13(b), a resist material is filmed on a surface opposite from the surface on which the metal thin film 8a is formed (the other surface of the glass substrate 3), and a circular segment pattern 12a (or an ellipse segment pattern) for forming the lens 4 is formed to define a resist film 12. In the resist film 12, a resist pattern is formed in which a circular segment portion of the circular segment pattern 12a is removed, and the circular segment pattern 12a is patterned further inside the interior lens shielding layer 9. A novolac polymer or a styrene polymer is used for the resist material. The styrene polymer has good transparency, and it is also used for a microlens of an image sensor.

Figure 14:
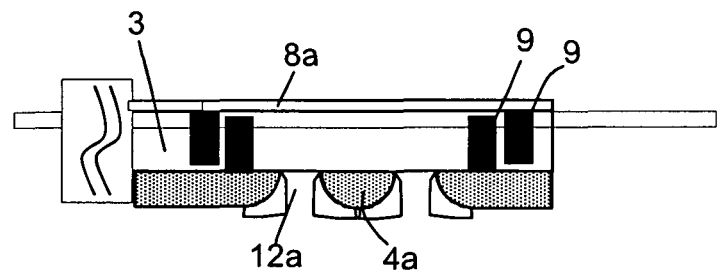
FIG. 14 is an essential part cross sectional view illustrating a shape of a resist material for forming the convex lens of FIG. 1, after a heat curing treatment.

By a subsequent heat treatment process, as illustrated in FIG. 14, an edge portion (corner portion) of the resist film 12, in which the circular segment pattern 12a is formed, is rounded and the resist material of a circular shape in a plan view in the middle portion is cured so that a surface thereof becomes a spherical lens shape 4a. The heat curing condition of the resist material is, for example, at 175 degrees Celsius for several minutes.

To the resist material and the glass substrate 3, anisotropy etching by RIE (Reactive Ion Etching) is performed with etching conditions to equalize the etching rate of the resist material and the glass substrate 3. The anisotropy etching is performed by dry etching with $CHF_3$ (trifluoromethane) gas.

Figure 15:
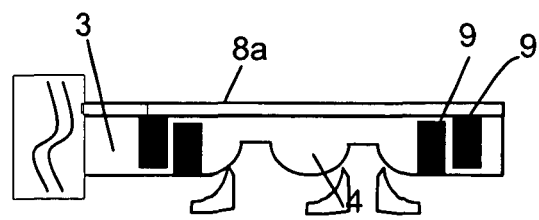
FIG. 15 is an essential part cross sectional view illustrating the case where a shape of a resist material is transferred to a glass substrate by anisotropy etching as the convex lens of FIG. 1.

As a result, a surface shape of the resist pattern is transferred on one surface of the glass substrate 3 and the convex lens 4 is formed as in FIG. 15. The spherical shape processing (convex lens surface processing) of the resist material by the heat curing is adjusted to obtain an optimum shape by controlling the composition of the resist material and the heat treatment processing temperature (approximately 175 degrees Celsius) and time (several minutes).

Figure 16:
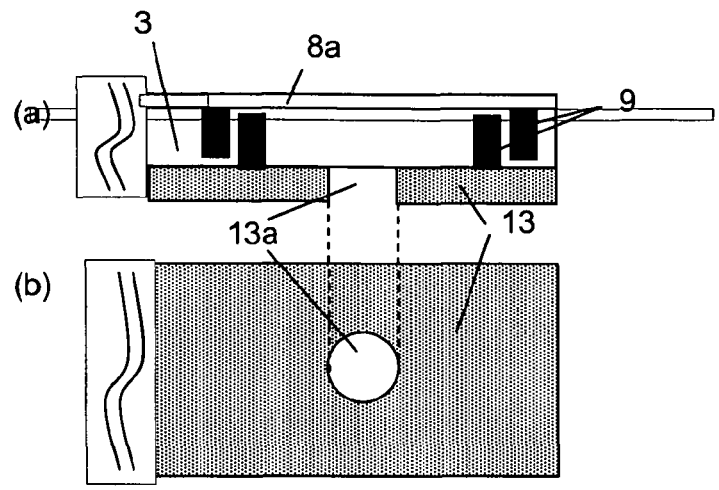
FIG. 16(a) is an essential part cross sectional view illustrating an exemplary pattern of a resist material for forming a concave lens on the glass substrate of FIG. 1.
FIG. 16(b) is a back surface view of the structure of FIG. 16(a).
Figure 17:
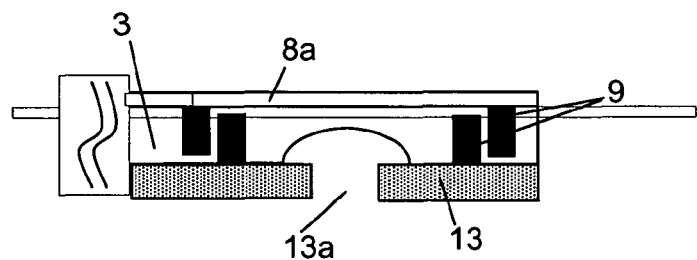
FIG. 17 is an essential part cross sectional view of the case where isotropy etching is performed on a glass substrate with the resist material of FIG. 16 as a mask.
Figure 18:
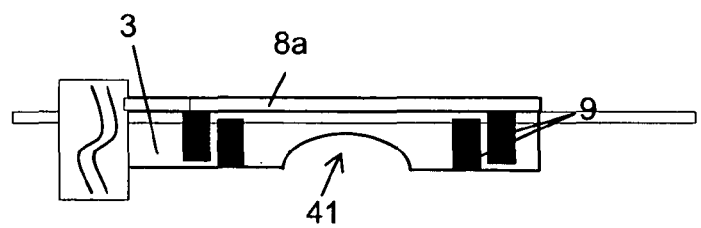
FIG. 18 is an essential part cross sectional view of the case where the unnecessary resist material of FIG. 17 is removed.

For example, when a concave lens 41 as illustrated in FIG. 18 is formed as the lens 4, a circular pattern 13a is formed to be a resist pattern 13 on a surface (lower surface) opposite from the surface of the metal thin film 8a side, which is laminated on the glass substrate 3 as illustrated in FIGS. 16(a) and 16(b), in such a manner that a central optical axis of the concave lens 41 is disposed at the center of the circular pattern 13a for forming a lens (it may also be a pattern in which a circular portion is removed by a removing solution, or a pattern in which a ellipse portion is removed by a removing solution). The center of the circular pattern 13a corresponds to the center of the circular lens shielding layer 9. Subsequently, as illustrated in FIG. 17, isotropy etching is performed on the glass substrate 3 by RIE (Reactive Ion Etching) or wet etching. The isotropy etching by wet etching is performed with BHF (Buffered Hydro Fluoric acid).

After the etching, the resist pattern 13 is removed by the resist removing solution as illustrated in FIG. 18, and the formation of the concave lens 41 is completed. The size of the concave lens 41 is proportional to the diameter of the circular pattern 13a in the resist pattern 13 and the etching time, and therefore, the diameter of the circular pattern 13a in the resist pattern 13 and the etching time may be adjusted for an optimum etching condition in accordance with an optical size of an image capturing element (CCD sensor or CMOS sensor) to be disposed.

Figure 19:
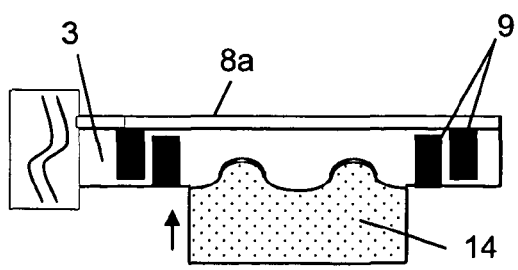
FIG. 19 is an essential part cross sectional view of the case where the convex lens of FIG. 1 is formed by the pressure to a glass substrate by a high temperature stamper as a different method.
Figure 20:
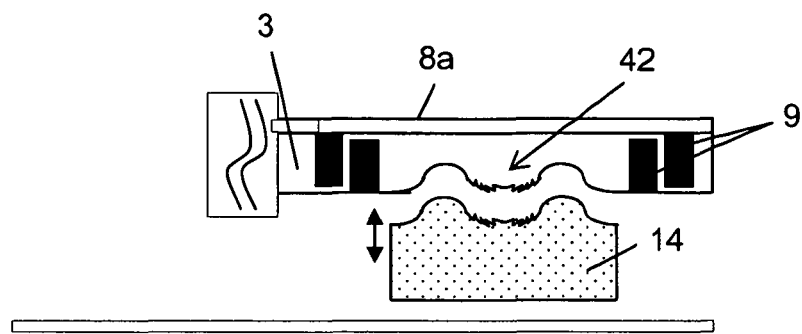
FIG. 20 is an essential part cross sectional view of the case where the convex lens of FIG. 1 is formed by the pressure to a glass substrate by a high temperature stamper in a Fresnel lens shape, as a further different method.
Figure 21:
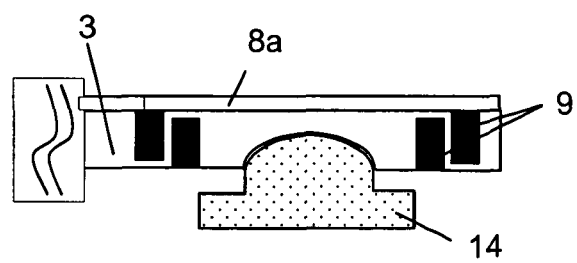
FIG. 21 is an essential part cross sectional view of the case where the concave lens of FIG. 16 is formed by the pressure to a glass substrate by a high temperature stamper as a further different method.

In addition, as in FIGS. 19 to 21, the lens shape of a high temperature stamper 14 can be transferred to the lower surface of the glass substrate 3 by pressing the lower surface of the glass substrate 3 with the high temperature stamper 14. In this case, the shape of the high temperature stamper 14 can be changed to any shape so that a lens shape 42 of a Fresnel lens in FIG. 20, for example, can be formed with a high degree of freedom. The method for forming the lens is not limited to the method using the above described etching and the high temperature stamper 41; however, any method for forming a lens may be used as long as the glass substrate 3 can be formed into a predetermined lens shape such as a concave or convex shape or the Fresnel shape. In this case, the temperature of the high temperature stamper 14 is at the deformation point temperature of glass or near that temperature. The deformation point temperature of glass is different depending on the kind of glass material.

Further, the order of the step of forming the lens shielding layer 9 and the step of forming the lens 4 is not limited; however the order may be switched and the steps maybe combined. Hereinafter, the description simply describes the lens 4 as lens 4 unless the lens shape is clearly distinguished. Further, in the figures, the lens is illustrated as a convex lens 4; however, without the limitation to this, the lens 4 may also be a concave lens shape 41 or a lens shape 42 with the Fresnel shape.

Figure 22:
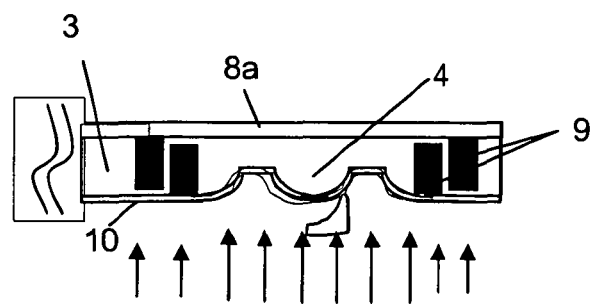
FIG. 22 is an essential part cross sectional view illustrating a step of coating an IR cut material on a lens surface.
Figure 23:
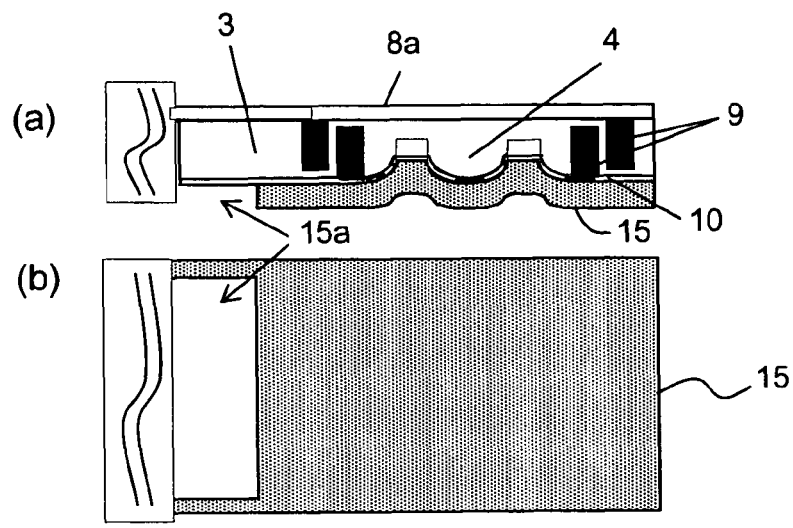
FIG. 23(a) is an essential part cross sectional view illustrating a patterning step of patterning a coated IR cut material.
FIG. 23(b) is a back surface view of the structure of FIG. 23(a).

Next, when the IR cut material 10 is coated on the glass substrate 3 on the lens forming surface side, the IR cut material 10 is coated thin on the entire glass substrate 3 on the lens forming surface side as in FIG. 22. When the unnecessary IR cut material 10 is removed as needed, a resist pattern 15 (a pattern in which a resist is removed from a portion 15a where the IR cut material 10 is removed) as illustrated in FIG. 23 is patterned on the IR cut material 10 on the surface on which the lens 4 is formed, a part of the IR cut material 10 is removed from the glass substrate 3 with the resist pattern 15 as a mask, and subsequently, the resist material is removed by a resist removing solution, so that the shape of the IR cut material 10 in FIG. 24 can be obtained.

Figure 24:
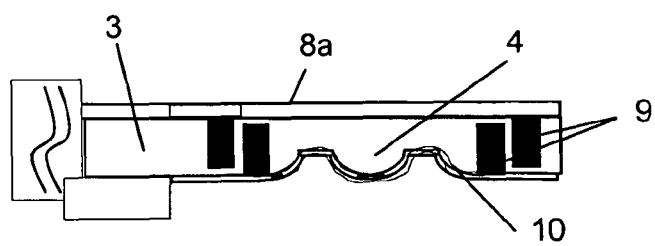
FIG. 24 is an essential part cross sectional view illustrating a shape of an IR cut material on a lens surface formed by the patterning step of FIG. 23.

Herein, the patterning of the IR cut material 10 is performed as in FIG. 24 for convenience' sake; however, there is no need for the patterning when there is no unnecessary part of the IR cut material 10.

Figure 25:
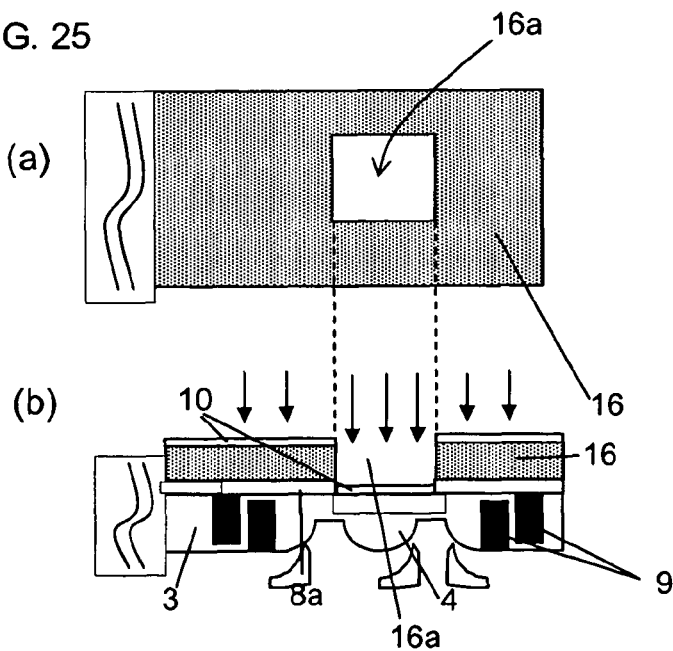
FIG. 25(a) is a plan view illustrating an IR cut material forming step of forming an IR cut material on a surface of a glass substrate on the side of the disposing surface for an image capturing element, with a resist film as a mask.
FIG. 25(b) is an essential part cross sectional view of the structure of FIG. 25(a).
Figure 26:
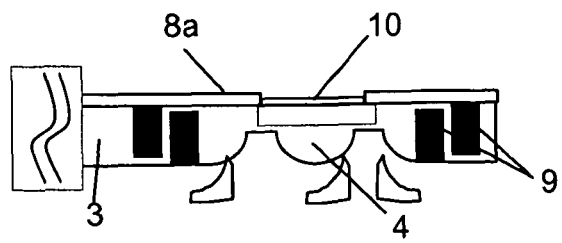
FIG. 26 is an essential part cross sectional view illustrating a shape of an IR cut material formed through the IR cut material forming step of FIG. 25.
Figure 28:
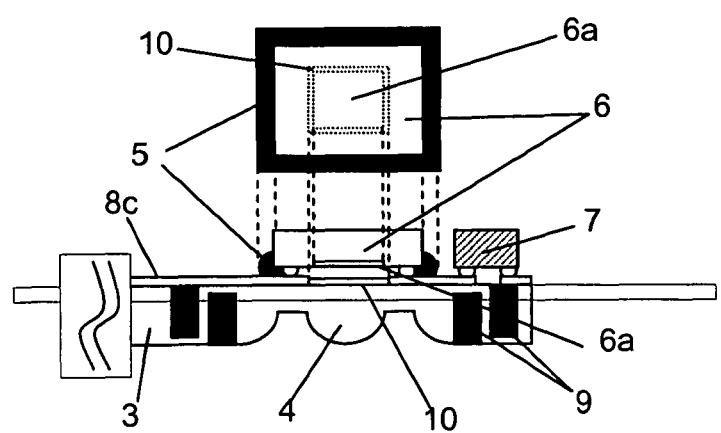
FIG. 28 is an essential part plan view and an essential part cross sectional view illustrating an exemplary configuration where an image capturing element and a group of other elements, which are sealed with a shielding material and disposed on a glass substrate, are connected to each other by a wiring pattern formed of a thin metal film.

When the IR cut material 10 is coated on the surface (surface on which the metal thin film 8a is laminated) opposite from the surface on which the lens 4 is formed, as illustrated in FIG. 25(a), a resist rectangular pattern 16a, which is larger than the light receiving surface 6a of the image capturing element 6, is formed, and the metal thin film 8a laminated on the glass substrate 3 is etched with a resist pattern 16 having the resist rectangular pattern 16a formed therein as a mask, and subsequently, the IR cut material 10 is coated as illustrated in FIG. 25(b). Subsequently, the resist pattern 16 is removed to obtain the shape of the IR cut material 10 as in FIG. 26. FIG. 28 illustrates an example of the positional relationship and the shape of the light receiving surface 6a of the image capturing element 6 and the coating surface of the IR cut material 10.

As described above, when the IR cut material 10 is coated thin on a surface on which the metal thin film 8a is laminated, it is necessary to coat the IR cut material 10 thin only on a path through which light after being focused by the lens 4 enters the light receiving surface 6a of the image capturing element 6 because the metal thin film 8a itself performs the role of shielding the entire incident light including infrared rays. On the other hand, when the IR cut material 10 is coated thin on the surface side on which the lens 4 is formed, it is necessary to coat the IR cut material 10 in such a manner to cut infrared ray components from the entire light that enters the lens shielding layer 9 so that infrared ray components are not mixed with light after being focused by the lens. Therefore, an optimum coating pattern is formed for each of the glass substrate surfaces on which the IR cut material 10 is coated thin. Vapor deposition, for example, can be used as a method for coating the IR cut material 10; however, without the limitation to this, any method can be used as long as the IR cut material 10 is coated at an even film thickness. Further, the patterning of the IR cut material 10 is not limited to the method and shape that are described previously; however, any method can be used as long as infrared ray components entering the image capturing surface can be cut. Note that this step is omitted when the IR cut material 10 is coated directly on the image capturing element 6.

Figure 27:
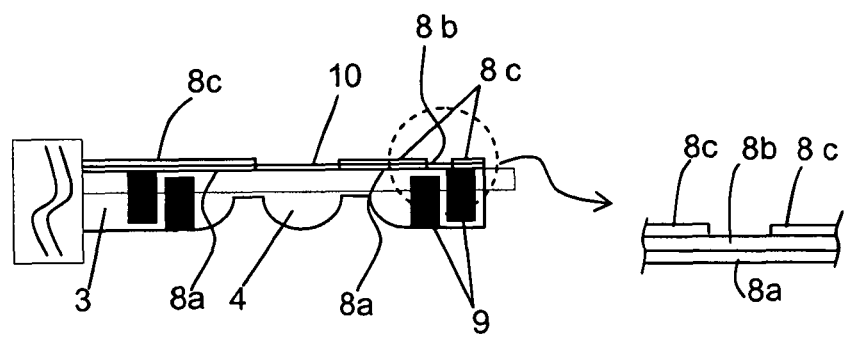
FIG. 27 is an essential part cross sectional view illustrating a state where a wiring pattern of a metal thin film is provided to connect a display apparatus, an image capturing element and a group of other elements to the glass substrate of FIG. 1.

Next, as illustrated in FIG. 27, the insulation film 8b is formed on the metal thin film 8a for shielding light, and the metal thin film 8c for wiring is formed further on the insulation film 8b. Further, a wiring pattern of the metal thin film 8c is formed so that the display apparatus 2 is wired with the image capturing element 6 and the group the other elements 7. In the same manner as previously described in the lens forming step or IR cut material coating step, this wiring pattern forming step patterns the metal thin film 8c as a predetermined wiring pattern by resist patterning and RIE or wet etching. The etching method is not limited to this; however, any method can be used as long as the patterning of the wiring of the metal thin film 8c is possible.

The order of the previously described IR cut material coating step and the metal wiring patterning step is not limited; however, the order may be switched and the steps may be combined.

Lastly, each of elements is connected in accordance with the wiring pattern of the metal thin film 8c so that the image capturing element module 20 in FIG. 1 is completed.

FCB (Flip Chip Bond), for example, can be used as the connecting method for each of the elements; however, without the limitation to this, any method can be used as long as each of the elements can be electrically connected to the wiring pattern of the metal thin film 8c. However, when the image capturing element 6 (CMOS sensor or CCD sensor) is connected, the gap between the glass substrate 3 and the image capturing element 6 is sealed by a shielding material 5 as in FIG. 28 so that light will not enter from the connecting section side. As the method for sealing the gap, a sealing method with a heat curing resin, such as ACP (Antisotropic Conductive Paste) which is an anisotropy conductive adhesive, could be used; however, without the limitation to this, any method can be used as long as light can be shielded while the electric connection is maintained at the connecting surfaces. Any material (same material or different material) can be used for the shielding material used for the lens shielding layer 9 and the shielding material 5 used for sealing the image capturing element 6. In accordance with the step of forming the image capturing element module 20 according to the present invention, optimum materials may be used in each case.

Figure 29:
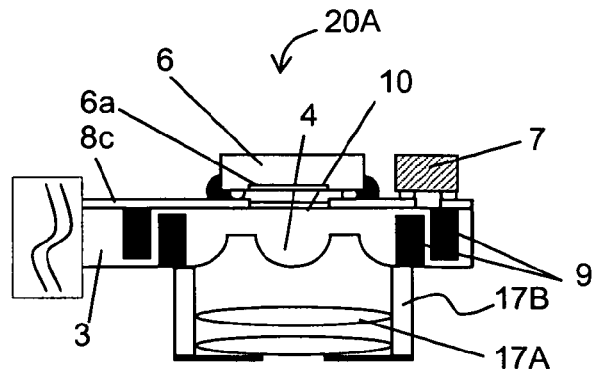
FIG. 29 is an essential part cross sectional view illustrating one exemplary structure of a case where another group of lenses are added in addition to a lens on the glass substrate of FIG. 1.
Figure 30:
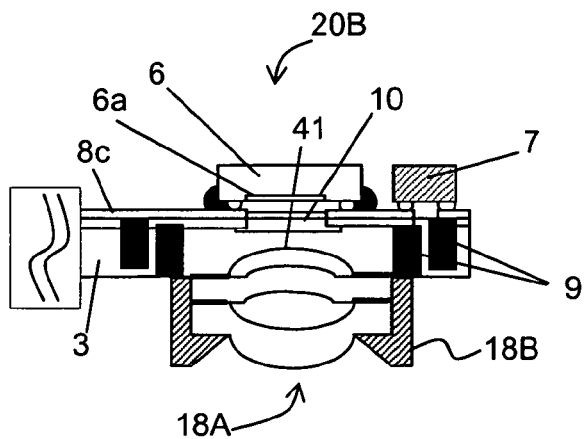
FIG. 30 is an essential part cross sectional view illustrating another exemplary structure of a case where another group of lenses are added in addition to a lens on the glass substrate of FIG. 1.

In Embodiment 1 described above, a case where one lens 4 is used has been described; however, without the limitation to this, it is also possible to have a structure in which another or plurality of lens groups, for example, a group of two lenses 17A, are disposed facing the lens 4 to be combined, in accordance with the optical performance, in addition to the lens 4 of the glass substrate 3, as in FIG. 29. In this case, as an image capturing element module 20A, one or plurality of lens groups, for example, a group of two lenses 17A herein, are maintained in a lens holder 17B, which has a cylindrical shape and has a light shielding characteristic, and the lens holder 17B, together with the group of two lenses 17A, is disposed facing the lens 4 of the glass substrate 3. In this case, it is necessary to orient the positions of the lens holder 17B and the interior lens shielding layer 9 to secure the light shielding characteristic. Without the limitation to the group of two lenses 17A maintained in the lens holder 17B, as an image capturing element module 20B illustrated in FIG. 30, one or plurality of lens groups, for example, a group of different kinds of two lenses 18A herein, are laid on top of another at peripheral flanges in the periphery of the lens section and the peripheral flanges are successively adhered corresponding to the lens 4. Subsequently, a shielding member 18B (shielding holder) covers the lenses and is adhered thereon.

(Embodiment 2)

In Embodiment 1 described above, a case has been described where the direction of the display screen of the display apparatus 2 is opposite from the direction in which the image capturing element module 20 captures an image. In Embodiment 2, a case will be described where the direction of the display image of the display apparatus 2 is the same as the direction in which an image capturing element module 20C, which will be described later, takes in incident light and captures an image.

Figure 31:
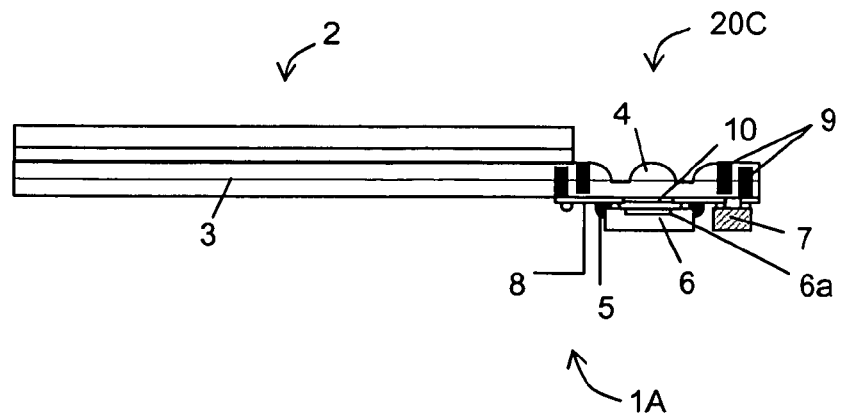
FIG. 31 is a longitudinal cross sectional view illustrating an exemplary essential structure of a display element and image capturing element module according to Embodiment 2 of the present invention.

FIG. 31 is a longitudinal cross sectional view illustrating an exemplary essential structure of a display element and image capturing element module according to Embodiment 2 of the present invention.

In FIG. 31, a display element and image capturing element module 1A according to Embodiment 2 is an image capturing element with an integrated display element. The display element and image capturing element module 1A includes: a display apparatus 2 disposed on a glass substrate 3; a lens 4 having a curved surface on the same surface as the display apparatus 2; lens shielding layers 9 and 9 having a double circular shape in a plan view, for shielding an outer circumference side of the lens 4 in a plan view; an image capturing element 6 disposed by sealing the periphery of a chip by a shielding material 5 while a light receiving surface 6a is facing a surface (lower surface) opposite from a disposing surface of the display apparatus 2 with respect to the lens 4; and a group of other elements 7, which are various electronic members such as a driver disposed on a surface of the side on which the image capturing element 6 is disposed. An image capturing element module 20C is configured of the lens 4, the shielding material 5, the image capturing element 6 and the lens shielding layers 9 and 9, other than the display apparatus 2.

That is, the display apparatus 2 (for example, a liquid crystal panel or an organic EL panel or the like, as a display element) is disposed on the glass substrate 3, and the lens 4 is formed from a part of the glass substrate 3 in the periphery of the display apparatus 2. On a lower surface of a glass substrate 3 opposite from the surface on which the lens 4 is formed (upper surface), the image capturing element 6 is disposed corresponding to the position of the lens 4, and the periphery of the image capturing element 6 is sealed by the shielding material 5. Together with the group of other elements 7, the image capturing element 6 is wired by a multilayered wiring pattern 8 including a metal thin film 8a, which has a light shielding characteristic and will be later described, such as aluminum. Electronic parts, such as a controller and a drier for driving the display apparatus 2 and an image processing element, can be used as the group of the other elements 7, and the group of the other elements 7 may be disposed on the outside of the glass substrate 3.

According to Embodiments 1 and 2 described above, the lens 4 is formed on the glass substrate 3, on which the display apparatus 2 is disposed, and the image capturing element 6 is disposed at a lens forming part of the lens 4, so that the lens 4 and the image capturing element 6, which is a constituent element of any of the image capturing element module 20 and 20A to 20C as a camera module, is integrated with the glass substrate 3 on which the display apparatus 2 is disposed. Since the lens 4 also serves as the glass substrate 3 of the display apparatus 2, the cost for the material per lens of the lens 4 and the height (size) can be reduced. In addition, the image capturing element 6 is connected by the wiring of the metal thin film 8 on the glass substrate 3, and the metal thin film wiring from the display apparatus 2 and the wiring of the metal thin film 8c are integrated to be one signal wiring group on the glass substrate 3, so that an FPC for input and output can be united, thereby increasing the wiring efficiency, downsizing the terminal, and reducing the cost. Further, the image capturing element 6 is integrated with the display apparatus 2, so that it becomes possible to directly display an image from the image capturing element 6 to the display apparatus 2, without the use of an CPU (central processing unit; control section) of the main body, thereby achieving the fast depicting of an image on a display screen of the display apparatus 2 and lowering of the power consumption. Further, on the terminal manufacturing side, the installing step can be eliminated for any of the image capturing element module 20 and 20A to 20C as a camera module, making it possible to shorten the TAT. In addition, on the camera module manufacturing side, by changing only the size of the lens 4 and wiring pattern on the glass substrate 3, it becomes possible to have a compatibility with various optical size of the image capturing element 6, which eliminates the necessity of customizing of the FPC wiring for each terminal model. Further, the standardizing of the terminal position of the image capturing element 6 eliminates the necessity of changing of the wiring pattern, and what is required will be only the changing of the size of the lens 4.

The metal thin film 8a is provided on the translucent support substrate (the glass substrate 3) surrounded by the shielding layer 9, as a metal layer for shielding a light on the translucent support substrate (the glass substrate 3) other than the middle portion for permitting light to enter of the lens 4. However, without the limitation to this, it is possible to use a conductive thin film containing carbon for shielding light and an insulation film having a light shielding characteristic, as long as it is a light shielding film.

(Embodiment 3)

Figure 32:
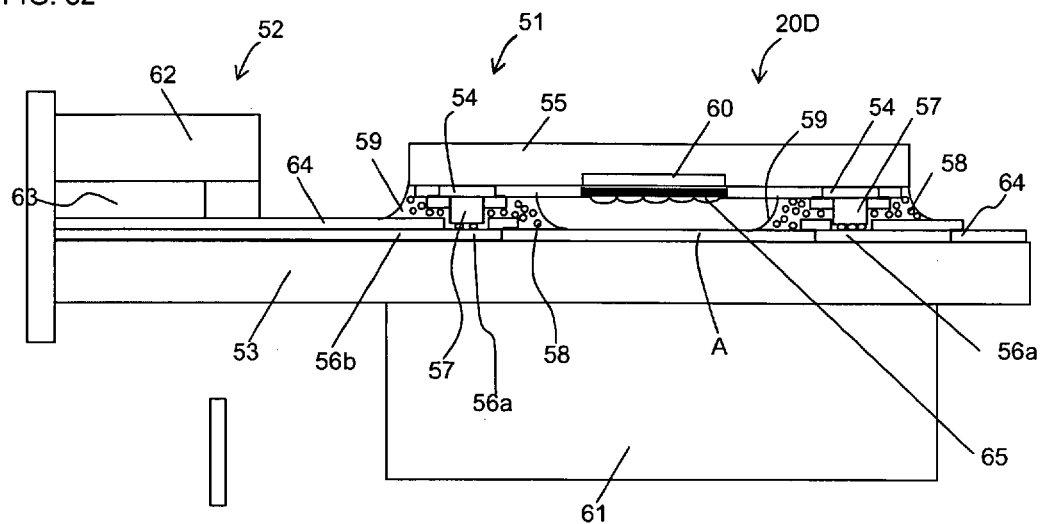
FIG. 32 is an essential part cross sectional view illustrating an exemplary structure of a liquid crystal display module with an integrated light receiving element according to Embodiment 3 of the present invention.

FIG. 32 is an essential part cross sectional view illustrating an exemplary structure of a liquid crystal display module with an integrated light receiving element according to Embodiment 3 of the present invention.

In FIG. 32, a liquid crystal display module with an integrated light receiving element 51 as a display element and image capturing element module includes a translucent support substrate 53, which configures a part of a liquid crystal display 52 functioning as a display (display apparatus), and a light receiving element chip 55 disposed on the translucent support substrate 53. The light receiving element chip 55 functions as an electronic element and includes an electrode pad 54 functioning as an electrode section for an external wiring. Each electrode pad 54 of the light receiving element chip 55 and a land section 56a of the translucent support substrate 53, such as a glass substrate, are electrically connected with each other by a conductive protrusion 57. A connecting section between the translucent support substrate 53 and the light receiving element chip 55 is bonded with a resin 59 for adhering. The resin 59 includes conductive particles 58 disposed therein, whose surfaces are coated with a conductive film, such as gold. The resin 59 is disposed in such a manner to avoid a positioning range for a light receiving area 60. A lens unit 61 focuses an incident light onto the light receiving area 60 (image capturing area) as an element area of the light receiving element chip 55, and the lens unit 61 is provided on the translucent support substrate 53 (back surface) on the opposite side of the light receiving element chip 55. The circumference of the lens unit 61 is shielded from light, except for a light entering opening, with one or plurality of lenses being maintained by a shielding holder.

An image capturing module 20D is configured such that the light receiving element chip 55 is fixed on a front surface side of the translucent support substrate 53 with an adhesive, such as the resin 59, and the lens unit 61 is fixed on a back surface side of the translucent support substrate 53 in such a manner to focus incident light the light receiving area 60 of on the light receiving element chip 55.

On the other hand, the liquid crystal display 52 is configured by laying two translucent support substrates 53 and 62 vertically on top of one another and enclosing a liquid crystal material 63 therebetween. Various transparent glass materials and resin materials can be used as the translucent support substrates 53 and 62. A substrate wiring is provided on one surface (upper surface) of the translucent support substrate 53, and a wiring section 56b except for the land section 56a of the substrate wiring and at least a neighboring location thereof are covered with an insulation film 64 functioning as a protection film. The insulation film 64 protects around the land section 56a of the substrate wiring and other wiring section 56b from chemical and physical damages from an external environment.

Various material films are used as the substrate wiring material of the liquid crystal display 52, including aluminum, tantalum, tantalum nitride, nickel, molybdenum, copper, gold, platinum, tungsten, titanium, and ITO. The substrate wiring is formed as a single or multiple layers from among these materials. The material for the substrate wiring is selected from among the above materials as needed and is used differently depending on where it is used. In Embodiment 3, any of aluminum, tantalum nitride, titanium, and ITO is used in the liquid crystal display 52, and all or part of the materials are used for a substrate wiring drawn to an area for disposing the light receiving element chip 55, so that the substrate wiring can be manufactured in the area for disposing the light receiving element chip 55 in the same process as the case with the liquid crystal display 52, thereby preventing the manufacturing steps from being complicated.

As for a common liquid crystal display module, another substrate, other than a translucent support substrate that constitutes a part of a liquid crystal display, is provided as a substrate for disposing a light receiving element chip, and the translucent support substrate for the liquid crystal display and the substrate for disposing the light receiving element chip are connected with each other for the use. On the other hand, in Embodiment 3, since the light receiving element chip 55 is directly disposed on the translucent support substrate 53, which configures apart of the liquid crystal display 52, there is no need to prepare another substrate for disposing the light receiving element chip 55, which saves time and effort when connecting substrates. Furthermore, since the light receiving element chip 55 is directly disposed on the translucent support substrate 53, it becomes possible to downsize the liquid crystal display module with an integrated light receiving element 51.

The light receiving area 60 includes a plurality of light receiving sections provided therein for performing a photoelectric conversion on and capturing an image of incident light, and the light receiving area 60 is formed at a middle portion of the light receiving element chip 55. A microscopic lens 65 (microlens) is provided on the light entering surface side of the light receiving area 60 for the purpose of enhancing the light focusing performance. This is because a single pixel is small in a solid-state image capturing element (light receiving element chip 55) having a large number of pixels and the light focusing performance per pixel is lowered. The microscopic lens 65 is formed of a material, such as a styrene or acrylic resin, a silicon nitride film, and a silicon oxide film, or is formed with a plurality of layers of such materials. The peripheral area of the light receiving area 60 (referred to as a light receiving peripheral area, hereinafter), which surrounds the light receiving area 60, includes the electrode pad 54 as an electrode section. The electrode pad 54 exists at four sides or least at one side of the four sides of the light receiving element chip 55, which is a shape of a quadrilateral, for example, in a plan view. When the electrode pad 54 exists at one side, it is suitable to form a spacer and the like on the opposite side. The spacer may be a conductive protrusion or non-conductive protrusion. In general, a metal material, such as aluminum or copper, is used for the electrode pad 54. For the light receiving element chip 55, it is suitable to use a wire bump formed by a thin metal line as the conductive protrusion 57 provided on the electrode pad 54 in order to prevent the surface from becoming dirty. Although gold is commonly used as a thin metal line, aluminum or copper may also be used. In Embodiment 3, a wire bump made of gold is used because gold is insusceptible to oxidization among them and the form is stable. In the case where the electrode pad 54 is made of a copper-type metal, the detriments can be overcome by providing an aluminum-type metal on the outermost surface. The conductive protrusion 57 may be provided in a state of an individual piece of a chip or of a wafer, which is a state prior to the individual chip. With respect to manufacturing, the latter case is better for mass-production. The light receiving element chip 55, which includes the electrode pad 54 provided with the conductive protrusions 57, is disposed on the land section 56a of the translucent support substrate 53 provided with a substrate wiring (land section 56a and other wiring section 56b), by positioning each of the conductive protrusions 57 described above. For electric connections as these, the conductive protrusions 57 and the land 56a maybe directly connected with each other, or the conductive particles 58 may be interposed between the conductive protrusions 57 and the land 56a. At this stage, the connecting section of the light receiving element chip 55 can be bonded by the resin 59 without the use of the above connecting method, so that the connecting section between the light receiving element chip 55 and the translucent support substrate 53 can be protected. In the case of electric joint via the conductive particles 58, it is suitable to planarize the top of the wire bump in advance so that the interposing amount of the conductive particles 58 increases. When the size of the tip is defined approximately between 40 μm to 80 μm, the interposing amount of the conductive particles 58 can be secured. ACF (film) and ACP (paste), which is an anisotropy conductive resin material (a conductive adhesive in which electricity is conducted only in the pressurized longitudinal direction to be conducted, and electricity is not conducted in the unpressured transverse direction), are examples of resin materials that contain the conductive particles 58. On the other hand, an NCP and underfill material, for example, are examples of the resin materials that do not contain the conductive particles 58. Such resin materials as ACF, ACP, NCP, and underfill material can contain non-conductive particles. Such non-conductive particles include silica and alumina. These non-conductive particles are effective to bring the coefficient of thermal expansion closer to that of a conductive protrusion, glass and an IC chip since resin material has a high coefficient of thermal expansion in general. It is suitable to form the tip of the conductive protrusion 57 into a sharp point when the connecting section of the light receiving element chip 55 is bonded with an NCP or underfill material. In the method using an NCP where a resin is applied in advance prior to the connection of the light receiving element chip 55, it is possible to prevent an NCP material from being caught on a connection surface. In addition, in the method where the connection section is bonded by introducing the resin 59 after the light receiving element chip 55 is connected via the conductive protrusion 57, it is suitable for the tip to be a sharp-pointed shape so that the bonding pressure can be set low to reduce damage to the light receiving element chip 55. This is particularly effective when the thickness of the light receiving element chip 55 is 0.3 mm or less because the strength of the light receiving element chip 55 becomes weak. No matter which type of resin 59 is used, it is important to bond at least the connecting section of the light receiving element chip 55 so as not to cover the light receiving area 60 for the formation. Therefore, the amount of the resin 59 is adjusted and work, such as application (ACP (the type with conductive particles)), NCP (the type without conductive particles)), adhesion (ACF) and introduction (underfill material) are performed.

FIG. 32 illustrates an example where an ACP or ACF, which is a transparent resin material including the conductive particles 58, is used. In the case of the ACP, it is suitable for the conductive particles 58 to be 2 μm to 7 μm on average in diameter. Furthermore, it is suitable for the conductive particles 58 to be 2 μm to 4 μm in diameter, so that the number of the conductive particles 58 can be increased while the percentage of a constituent is the same. As a result, the interposing amount of the conductive particles 58 per terminal increases. This provides more secure electronic connection. If the number is extremely small, a proper electric connection will become difficult to achieve in terms of the technique and the cost. It is desirable for the percentage of the constituent to be in the range of 7 to 18 wt percent. Owing to this, it becomes possible to reduce the possibility that a lower density of conductive particles 58 will exist between terminals, thereby reducing the possibility of a short between adjacent terminals. When non-conductive particles are included, it becomes possible to control the separation between the translucent support substrate 53 and the resin 59 or between the light receiving element chip 55 and the resin 59. It is necessary to include non-conductive particles that have a smaller diameter than the conductive particles 58 so as not to interfere the electric connectivity by the conductive particles 58. For example, it is suitable for the diameter of the non-conductive particles to be 30 to 80 percent of the diameter of the conductive particles 58. That is, when the diameter of the conductive particles 58 is 5 μm, it is suitable for the diameter of the non-conductive particles to be 1.5 μm to 4 μm; and when the diameter of the conductive particles 58 is 3 μm, it is suitable for the diameter of the non-conductive particles to be 1 μm to 2.4 μm. In consideration of the workability, it is suitable for the percentage of the constituent of the non-conductive particles to be as high as possible so that the coefficient of thermal expansion can be reduced. With regard to the ACP, NCP and underfill material, it is desirable for the range to be 20 to 70 wt percent.

Figure 33:
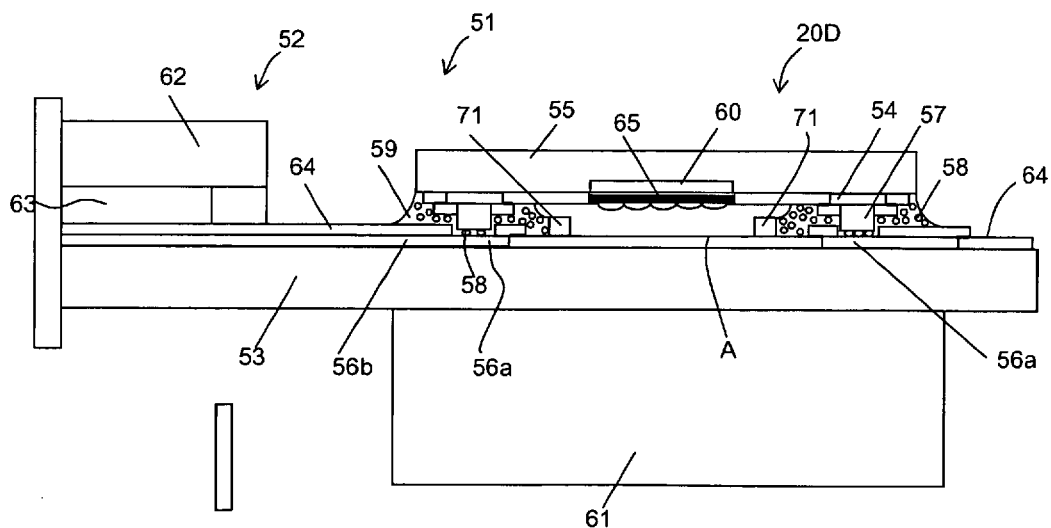
FIG. 33 is an essential part cross sectional view illustrating another exemplary structure of the liquid crystal display module with an integrated light receiving element according to Embodiment 3 of the present invention.

FIG. 33 is an essential part cross sectional view illustrating another exemplary structure of the liquid crystal display module with an integrated light receiving element according to Embodiment 3 of the present invention.

In FIG. 33, the liquid crystal display module with an integrated light receiving element 51 differs from the one in FIG. 32 in that a step section 71 is provided in an area laying on the light receiving peripheral area of the light receiving element chip 4 in the translucent support substrate 3.

It is suitable to provide the step section 71 in an area at least inside the connection section of at least the light receiving element chip 55 because it prevents the resin 59 from being formed in (spread into) the light receiving area 60. For example, when the connection section in the light receiving element chip 55 exists along one side of the rectangle or square in the plan view of the light receiving element chip 55, it is suitable to provide the step section 71 between the side and the light receiving area 60. Similar to this case, when the connection section exists along two sides of the rectangle or square in the plan view of the light receiving element chip 55, it is suitable to provide the step section 71 between the two sides and the light receiving area 60; when the connecting section exists along three sides, it is suitable to provide the step section 71 (barrage section; dam section) between the three sides and the light receiving area 60; and when the connecting section exists along four sides, it is suitable to provide the step section 71 between the four sides and the light receiving area 60. However, regardless of the number of the sides of each connection section, it becomes possible to more securely prevent the resin 59 from being flowed into the light receiving area 60 when the step section 71 is formed in a shape of a polygon, such as a quadrilateral, or a circle in such a manner to be substantially connected entirely and to surround the light receiving area 60.

In order to provide the step section 71, it is suitable to provide a material, which cures by the irradiation of electromagnetic waves, such as ultraviolet rays, and a resin, which is capable of fast curing at a low temperature, by using a depicting method, a printing method, an ink jet method and the like. Curing by electromagnetic waves or a hot plate enables local irradiation and heating, so that it is possible to prevent the liquid crystal display 52 from being damaged. Instead of the step section 71, it is also possible to provide a film of a material that has a characteristic to repel the resin 59 in a predetermined area on the translucent support substrate 53 opposite from the light receiving area 60. Furthermore, it is also possible to allow at least a side or a surface, or both the side and the surface, of the step section 71 to have a characteristic to repel the resin 59. In order to achieve this, a plasma treatment using a fluorine gas may be performed, or the step section 71 may be covered with a film of a material that has a characteristic to repel the resin 59. When the plasma treatment is performed, the step section 71 may not be required. In addition, the step section 71 itself may be formed of a material that repels the resin 59. Teflon (registered trademark) resin and an ITO material have a characteristic to repel the resin 59, such as epoxy resin. In particular, the ITO material is also used as a transparent electrode of the liquid crystal display 52. Therefore, when the transparent electrode is formed on the translucent support substrate 53, since the manufacturing process for the liquid crystal display 52 are common to the step section forming step and the surface treatment step, it becomes further suitable because the complication of the manufacturing can be avoided.

Figure 35:
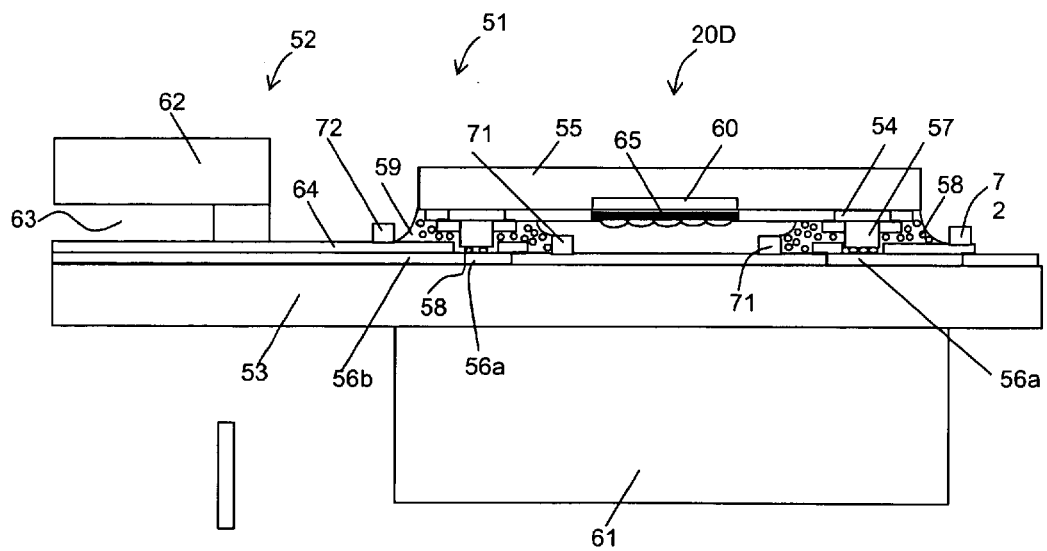
FIG. 35 is an essential part cross sectional view illustrating still another exemplary structure of the liquid crystal display module with an integrated light receiving element according to Embodiment 3 of the present invention.

Other than the step section 71 or the material that repels the resin 59, or the surface treatment for repelling the resin 59, as illustrated in FIG. 35, it is also possible to provide a step section 72, which repels the resin 59, in an outer circumference section (exterior side) of an area laying on the light receiving element chip 55 in the translucent support substrate 53. Owing to this, it becomes possible to prevent the resin 59 in the outer circumference section of the light receiving element chip 55 from being spread further to the outer circumference section. As a result, it becomes possible to prevent the resin 59 from flowing into other parts, such as the liquid crystal display 52. It is suitable to provide the step section 72, which repels the resin 59, at least between parts where the flow of the resin 59 should be prevented. It is further suitable to form the step section 72 into a shape that is a similar figure as the rectangle or square of the light receiving element chip 55 and the entirety is substantially in one piece in such a manner to surround the overall periphery of the light receiving element chip 55, so that it becomes possible to more securely limit the spread of the resin 59 to the outer circumference of the light receiving element chip 55.

Figure 34:
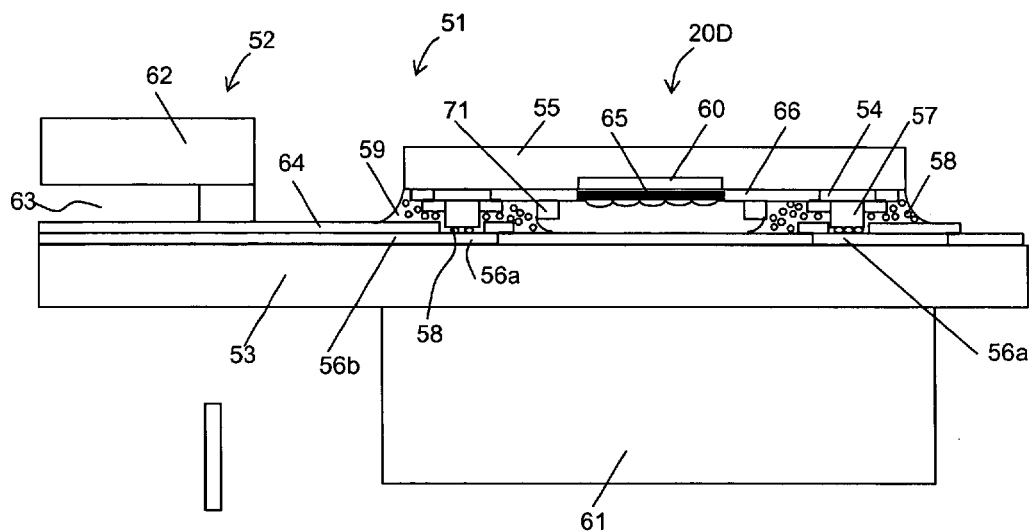
FIG. 34 is an essential part cross sectional view illustrating still another exemplary structure of the liquid crystal display module with an integrated light receiving element according to Embodiment 3 of the present invention.
Figure 36:
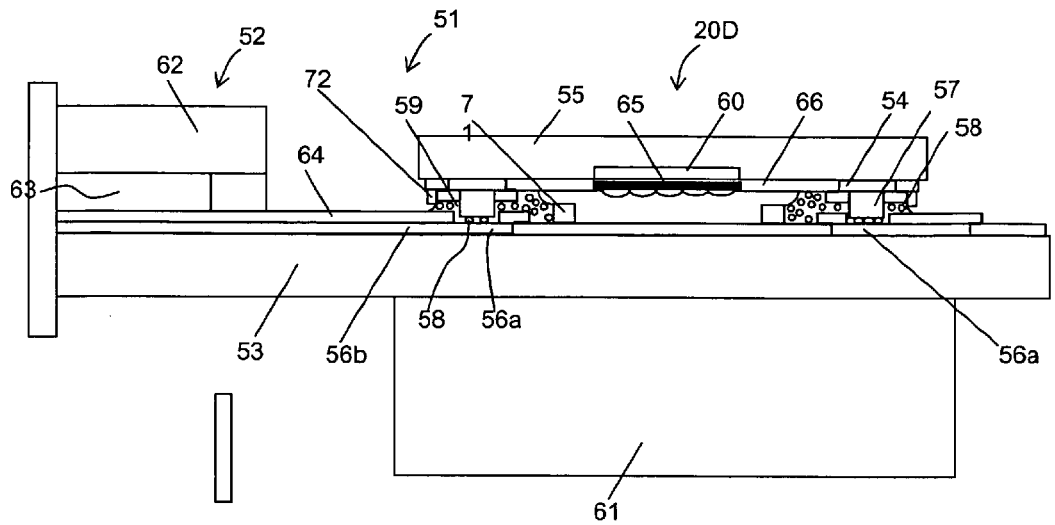
FIG. 36 is an essential part cross sectional view illustrating still another exemplary structure of the liquid crystal display module with an integrated light receiving element according to Embodiment 3 of the present invention.
Figure 37:
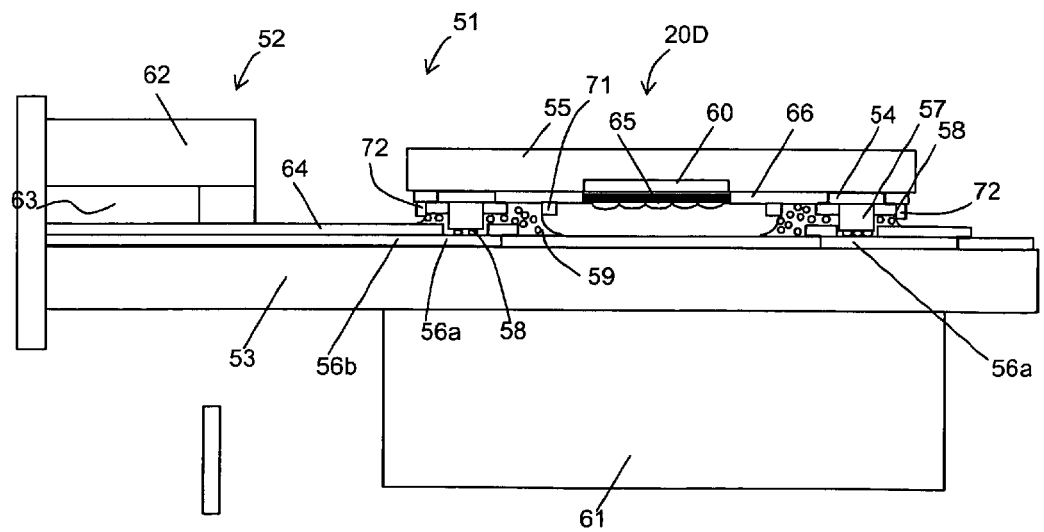
FIG. 37 is an essential part cross sectional view illustrating still another exemplary structure of the liquid crystal display module with an integrated light receiving element according to Embodiment 3 of the present invention.

Next, the step section 71 and/or step section 72 and, instead of or together with them, the material that repels the resin 59 or the surface treatment that repels the resin 59 are not limited to be provided on the side of the translucent support substrate 53 as illustrated in FIGS. 34, 36 and 37. They may be provided on the side of the light receiving element chip 55, and it is further suitable if they are provided on both sides of the translucent support substrate 53 and the light receiving element chip 55.

When the step sections 71 and 72 exist on the side of the light receiving element chip 55, the following effects can be observed.

The step section 71 of the light receiving peripheral area in the periphery of the light receiving area 60 and, instead of or together with them, the material that repels the resin 59 or the surface treatment that repels the resin 59 prevent the resin 59 from being flowed directly into the light receiving area 60. Furthermore, the step section 72 in the periphery of the light receiving element chip 55 and, instead of or together with them, the material that repels the resin 59 or the surface treatment that repels the resin 59 are capable of preventing the adhesion of the resin 59 to a bonding tool at the time of bonding the ACP, NCP and ACF material. In particular, this is effective for the ACP and NCP, which is in a paste form and is easy to cause a variation in the application form and the amount of the application. The step sections 71 and 72 to the side of the light receiving element chip 55 and, instead of or together with them, the material that repels the resin 59 or the surface treatment that repels the resin 59 may be formed by applying a resin material, which cures by the irradiation of electromagnetic waves, such as ultraviolet rays, and a resin material, which is capable of fast curing at a low temperature, by using a depicting method, a printing method, an ink jet method or the like. Furthermore, a plasma treatment by a fluoride gas may also be used. When the plasma treatment is performed on the translucent support substrate 53 or light receiving element chip 55, an area repelling the resin 59 can be readily and certainly formed in a desired area by patterning and masking with a photosensitive resist.

In the light receiving element chip 55 having a microscopic lens 65 made of an acrylic resin or the like, when the microscopic lens 65 is deteriorated due to heat or a reflection prevention film is further provided, it is necessary to provide a heat treatment at the temperature of 220 degrees Celsius or less so that the temperature does not become too high in order to prevent a crack of the reflection preventing film. Furthermore, this complication in the manufacturing can be prevented when this process is performed together with the manufacturing process of the light receiving element chip 55. For example, it is suitable to use a cover film 66, which is made of acrylic resin, a silicon oxide resin film, a silicon nitride film and the like. In particular, if the step section 71 is provided in the light receiving periphery area and/or the peripheral area of the light receiving element chip 55 at the same time as the formation of the microscopic lens 65 made of acrylic resin, the step section 71 suitably has a thicker thickness. Furthermore, a surface protection film, which is made of a silicon oxide film or a silicon nitride film, may be additionally formed on the surface of the step sections 71 and 72.

Figure 38:
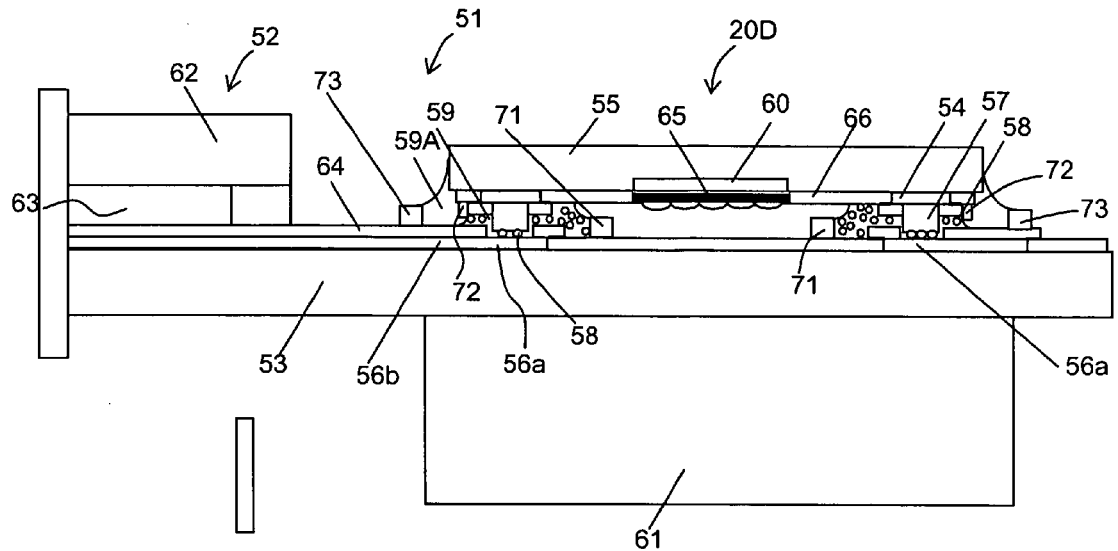
FIG. 38 is an essential part cross sectional view illustrating still another exemplary structure of the liquid crystal display module with an integrated light receiving element according to Embodiment 3 of the present invention.

FIG. 38 is an essential part cross sectional view illustrating still another exemplary structure of the liquid crystal display module with an integrated light receiving element according to Embodiment 3 of the present invention.

In FIG. 38, at least the connection section of the light receiving element chip 55 is bonded by the resin 59, which is an ACP resin; and further, the periphery of the resin 59 is bonded by a different resin 59A. Since it is possible to fix the light receiving element chip 55 by this different resin 59A, the strength is further increased against an impact from dropping, which is required in a cell phone device or the like. Furthermore, since it is possible to certainly make a space between the translucent support substrate 53 and the middle portion of the light receiving element chip 55 air tight, it becomes possible to prevent foreign substances and moisture from penetrating from the outside. When the different resin 59A is the same resin material including the conductive particles 58 as similar to the resin 59, the coefficient of thermal expansion will be the same. Therefore, it becomes possible to prevent the resin 59A and 59 from being separated at the interface. However, since the cost will increase in this case, it is suitable to include only non-conductive particles, such as silica. It is suitable to define the amount of non-conductive particles in the different resin 59A to be as much as the amount of non-conductive particles in the resin 59. Furthermore, it is suitable to adjust the amount of the non-conductive particles of the resin 59A such that the resin 59 including the conductive particles 58 and the different resin 59A have substantially the same coefficient of thermal expansion. When the resin 59, the different resin 59A, or the resin 59 and the different resin 59A include a substance with a light shielding characteristic, it becomes possible to prevent light from penetrating the side surface of the light receiving element chip 55.

Figure 39:
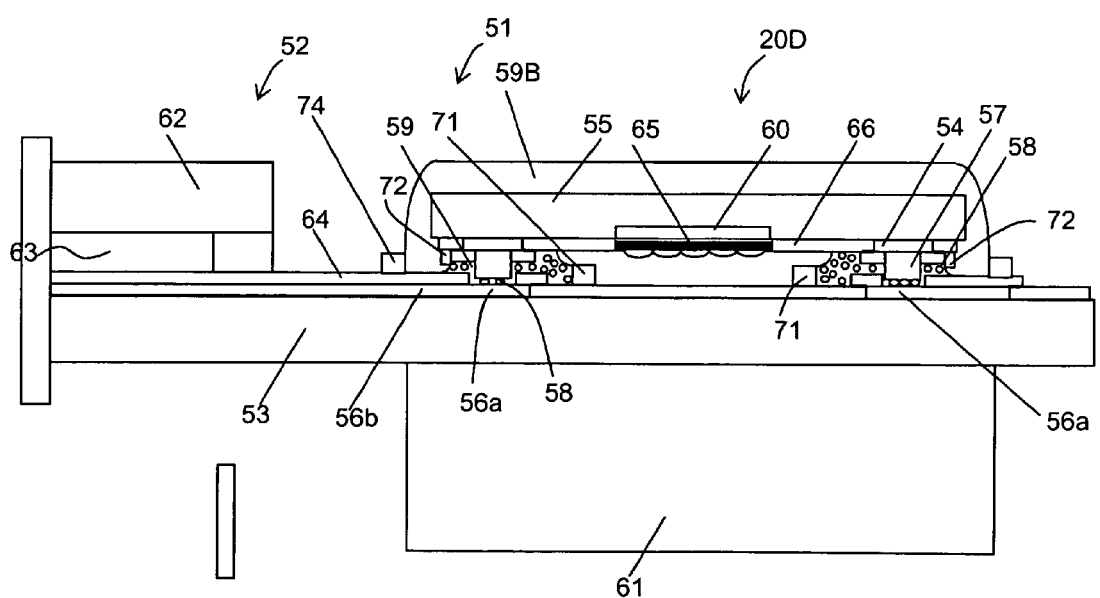
FIG. 39 is an essential part cross sectional view illustrating still another exemplary structure of the liquid crystal display module with an integrated light receiving element according to Embodiment 3 of the present invention.

FIG. 39 is an essential part cross sectional view illustrating still another exemplary structure of the liquid crystal display module with an integrated light receiving element according to Embodiment 3 of the present invention.

In FIG. 39, a back surface of the light receiving element chip 55 is covered with a sealing resin 59B, and the liquid crystal display module with an integrated light receiving element differs from the ones in other exemplary structures in that, in this example, the side and back surface of the light receiving element chip 55 are sealed in an integrated manner with the same resin material. Similar to the case with the resin 59A, it is suitable for the sealing resin 59B to have as much amount of non-conductive particles as the amount of non-conductive particles in the resin 59. Furthermore, it is suitable to adjust the amount of non-conductive particles in the resin 59 such that the resin 59 including the conductive particles 58 and the sealing resin 59B have substantially the same coefficient of thermal expansion. It is suitable for the resin 59, the sealing resin 59B, or the resin 59 and resin 59B to include a substance with a light shielding characteristic so that it becomes further possible to prevent light from entering the light receiving area 60. As a result, in addition to the effect with the structure of FIG. 38, the effect for the protection from physical and chemical damages from the outside increases, and the penetration of light from the back surface of the light receiving element chip 55 can be certainly prevented. This is especially effective in the case where the chip thickness is thin.

Figure 40:
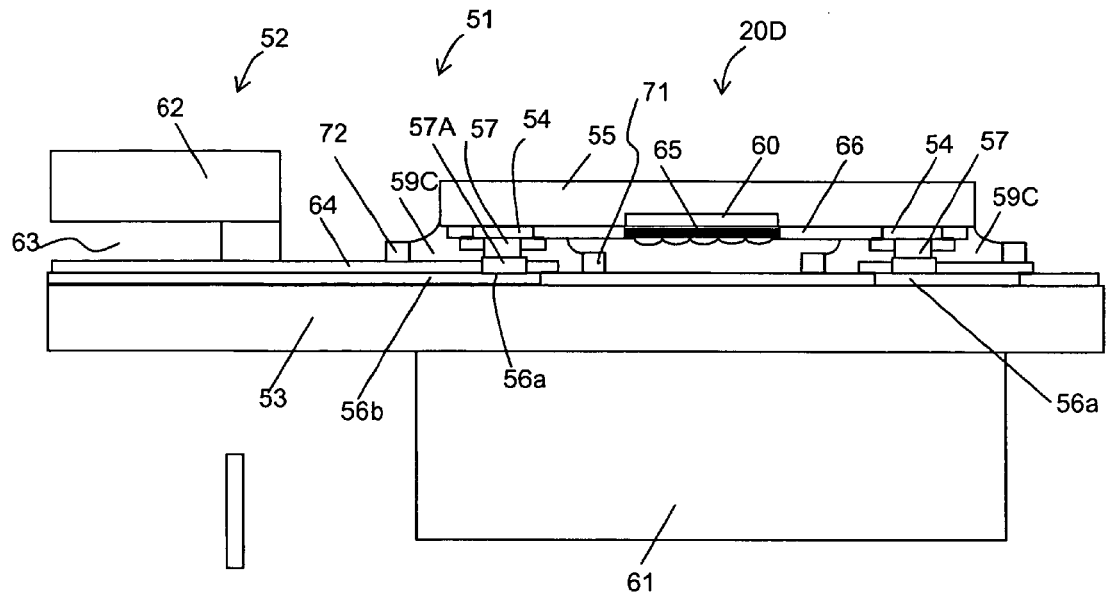
FIG. 40 is an essential part cross sectional view illustrating still another exemplary structure of the liquid crystal display module with an integrated light receiving element according to Embodiment 3 of the present invention.

FIG. 40 is an essential part cross sectional view illustrating still another exemplary structure of the liquid crystal display module with an integrated light receiving element according to Embodiment 3 of the present invention.

In FIG. 40, the liquid crystal display module with an integrated light receiving element differs from the ones in other exemplary structures in that a resin 59C uses an NCP or an underfill material that does not use the conductive particles 58 while the resin 59 in FIG. 35 uses the anisotropy conductive resin material using the conductive particles 58, such as an ACF or ACP.

When the underfill material is used, a conductive protrusion 57 and a conductive protrusion 57A on a land section 56a of a substrate wiring are joined to each other directly. A wire bump made of gold is formed as the conductive protrusion 57 and indium alloy, for example, is formed as the conductive protrusion 57A on the land section 56a, and they are connected to each other. After the connection, the underfill material is introduced. Again, the step sections 71 and 72 (barrage section; dam section) and/or the material repelling the resin 59C or the surface treatment repelling the resin 59C are provided in an area laying on the light receiving peripheral area of the light receiving element chip 55 and in the periphery of the light receiving element chip 55.

Therefore, by the step sections 71 and 72 and/or the material repelling the resin 59C or the surface treatment repelling the resin 59C, the underfill material is prevented from flowing of the resin 59C into the light receiving area 60, and the flowing of the resin 59C is prevented in the outer circumference section of the light receiving element chip 55. When the NCP is used, the NCP is provided in advance to the translucent support substrate 53 by drawing, printing and the like, is heat-pressed to the light receiving element chip 55 through the conductive protrusions 57 and 57A, and the connection section is bonded by the resin 59C while the pressure is being given. Again, by the step sections 71 and 72 and/or the material repelling the resin 59C or the surface treatment repelling the resin 59C, the resin 59C is prevented from flowing into the light receiving area 60 and the flowing of the resin 59C is prevented in the outer circumference section of the light receiving element chip 55. When the NCP is used, the conductive protrusion 57A may not be necessary.

Figure 41:
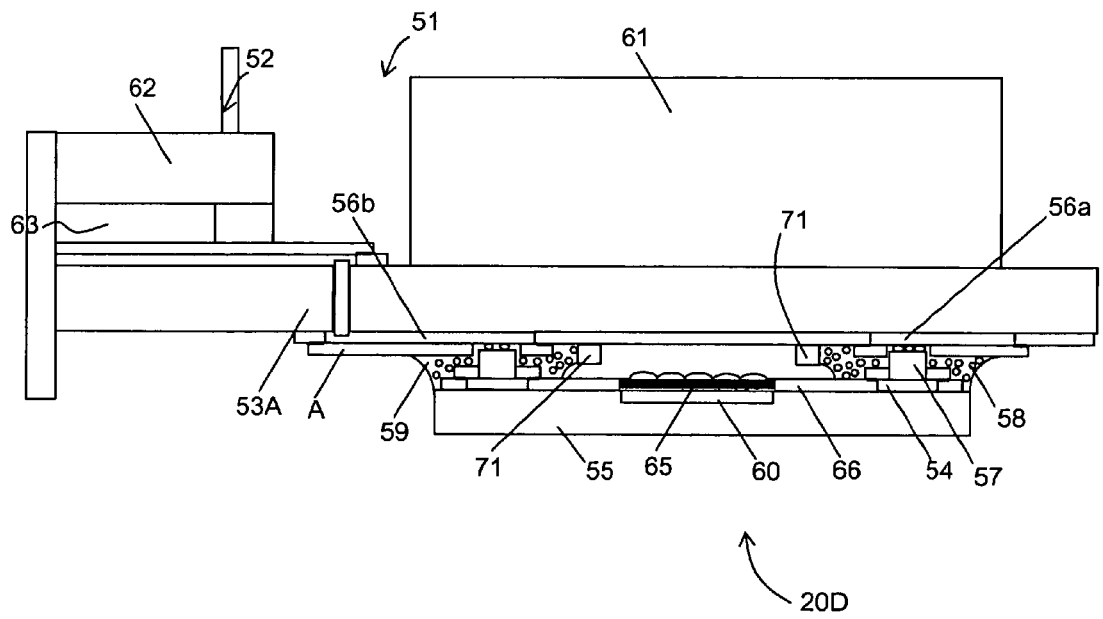
FIG. 41 is an essential part cross sectional view illustrating still another exemplary structure of the liquid crystal display module with an integrated light receiving element according to Embodiment 3 of the present invention.

FIG. 41 is an essential part cross sectional view illustrating a further different exemplary structure of the liquid crystal display module with an integrated light receiving element according to Embodiment 3 of the present invention.

In FIG. 41, the liquid crystal display module with an integrated light receiving element differs from the ones in other exemplary structures in that wirings are provided on both surfaces of a translucent support substrate 53A. A wiring, which passes through the translucent support substrate 53A through a through hole, may be provided between the wirings on both surfaces, or a wiring may be provided on a side surface of the translucent support substrate 53A to electrically connect the wirings on both surfaces. Unlike the cases in FIGS. 32 to 40, the light receiving element chip 55 can be connected to the side of the opposite surface of the translucent support substrate 53 through the conductive protrusion 57 by using the translucent support substrate 53A having wirings provided on both surfaces. In addition, various combinations of positions, materials and treatments are possible for the step section 71 and/or the material repelling the resin 59 or the surface treatment repelling the resin 59. For example, in the example of FIG. 40, they may be provided on the light receiving element chip 55. Further, a lens unit 61 is provided in FIGS. 32 to 41. Further, when a driving semiconductor element or the like is provided on the translucent support substrate 53, the further downsizing is possible. A plurality of the light receiving element chips 55 may be disposed, and it is conceived that, when the liquid crystal display 52 and the lens unit 61 are disposed on opposing surfaces of the translucent support substrate 53, it can be used as an out camera, when the liquid crystal display 52 and the lens unit 61 are disposed on the same surfaces of the translucent support substrate 53, it can be used an in camera. When two light receiving element chips 55 are provided on one surface, instead of disposing the light receiving element chips 55 on opposing surfaces, it can be used as an out camera and an in camera depending on the direction of the light receiving element chips 55.

According to Embodiment 3 with the structure described above, the light receiving element chips 55 is disposed on the translucent support substrate 53, which constitutes a part of the liquid crystal display 52, so that the liquid crystal display 52 and the light receiving element chips 55 can be closer to each other. As a result, the number of parts can be reduced in the liquid crystal display module with an integrated light receiving element 51, thereby making the liquid crystal display module with an integrated light receiving element 51 compact. In addition, since the wiring paths are shortened, the processing speed can be improved and the power consumption can be reduced. Further, it becomes possible to fix vision of callers in an electronic device having a television telephone apparatus which communicates image signals in two ways and a television telephone function. In liquid crystal display module with an integrated light receiving element 51 with the structure described above, it is possible to provide a structure with an excellent light focusing performance, clear light reception and image capturing.

As a result, the resin 59 bonds the connection portion for connecting the electrode pad 54 of the light receiving element chip 55 and the land section 56a of the wiring section of the glass substrate, which is the translucent support substrate 53, by the conductive protrusion 57, in such a manner to avoid the area corresponding to the light receiving area 60. Therefore, in miniaturizing the pixels, it is possible to prevent optical malfunctions due to the introduction of foreign substance or bubbles, together with the resin 59, into the inside, or the reduction of the light receiving efficiency of the microscopic lens 65 due to such foreign substance or bubbles enclosed between the light receiving element chips 55 and the translucent support substrate 53 and the relationship with the refractive index with the resin 59.

It is possible to combine the connection configuration of the light receiving element chips 55 with respect to the translucent support substrate 53 in Embodiment 3 with aforementioned Embodiments 1 and 2. However, what is mainly described in Embodiments 1 and 2 is that a lens as an optical element is formed on a glass substrate (or a transparent resin substrate) as the translucent support substrate 53. Therefore, in Embodiments 1 and 2, the connection configuration of the light receiving element chips 55 is only briefly described in Embodiments 1 and 2. In addition, the light shielding structure of Embodiments 1 and 2 can be applied in Embodiment 3.

In addition, in Embodiment 3, the use efficiency of light increases if the protection film A of the area facing the light receiving area 60 is removed among the protection films A in FIGS. 32 and 33, for example.

Furthermore, the connection section, in which the conductive particles 58 of a anisotropy conductive resin material is interposed between the land section 56a in the substrate wiring of the translucent support substrate 53 and the conductive protrusion 57 on the electrode pad 54, is bonded with the resin 59 in such a manner to completely cover it from the outside. Therefore, although not specifically described in Embodiment 3, the resin 59 shrinks and the size is reduced when the resin 59 is cured. This provides a stable contact because the conductive protrusion 57 and the land section 56a function in the direction that presses the conductive particles 58.

(Embodiment 4)

Figure 42:
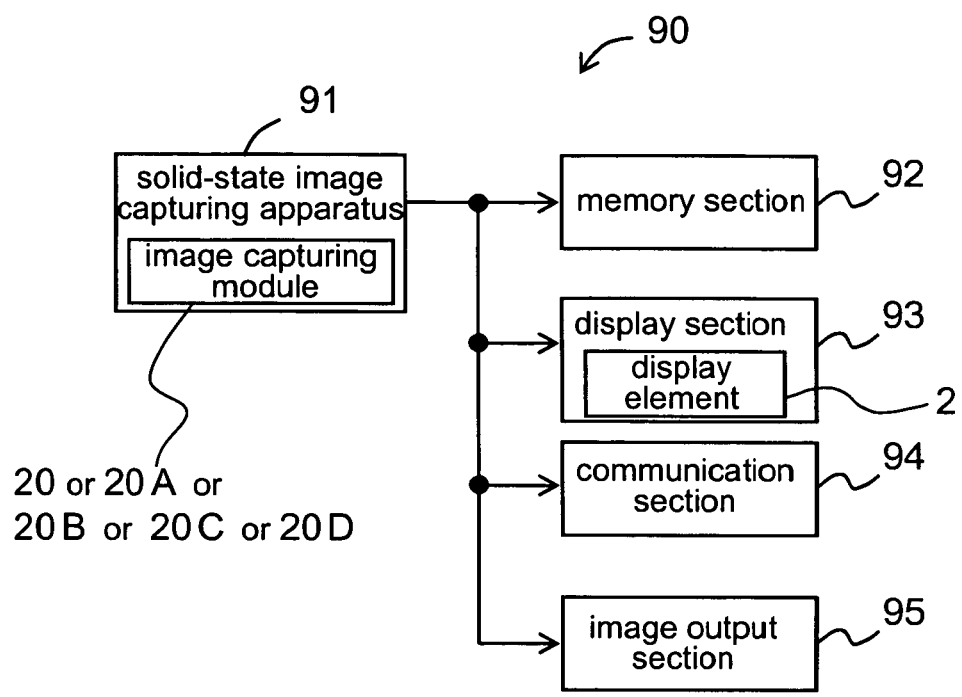
FIG. 42 is a block diagram schematically illustrating an exemplary configuration of an electronic information device as Embodiment 4 of the present invention, using the display element and image capturing element modules according to Embodiments 1 to 3 of the present invention in a display section and an image capturing section thereof.
Figure 43:
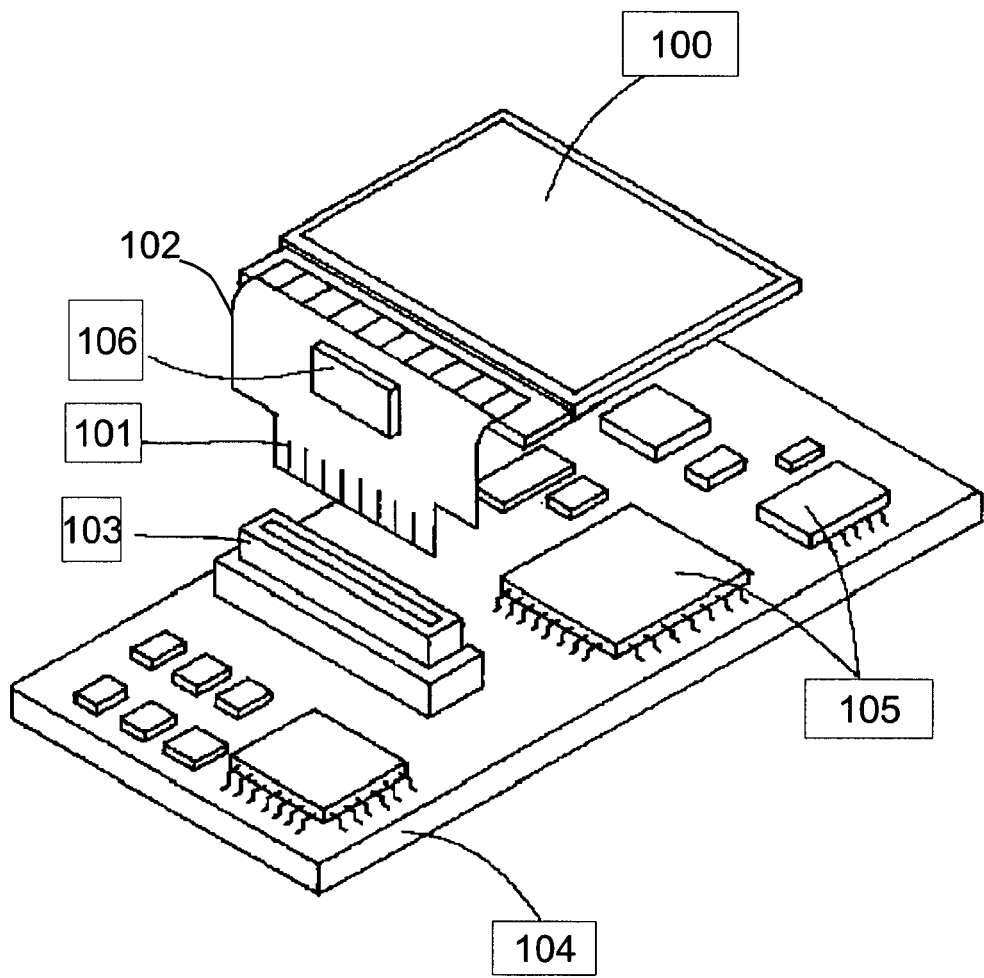
FIG. 43 is a perspective view illustrating a conventional liquid crystal display apparatus and a resin substrate for connecting the liquid crystal display apparatus.
Figure 44:
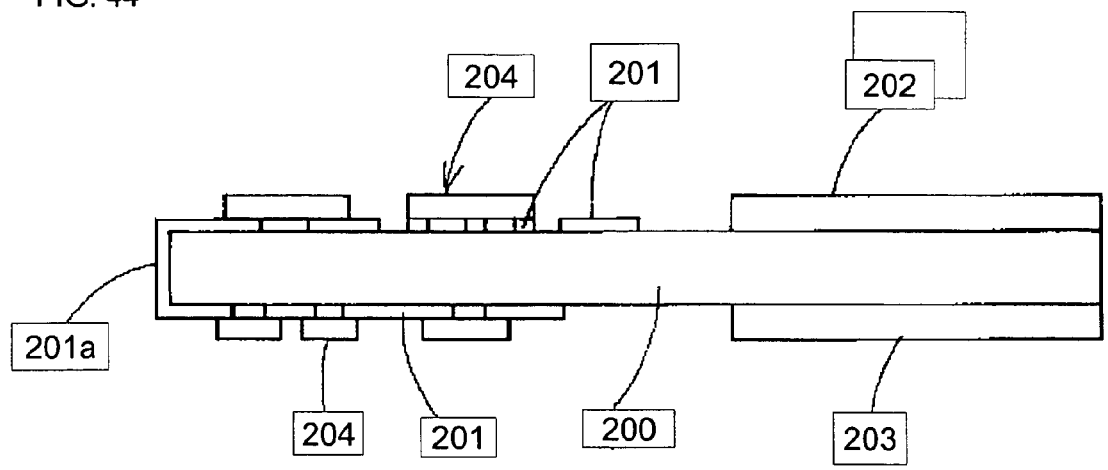
FIG. 44 is a cross sectional view of a conventional liquid crystal display apparatus and a plurality of electronic parts installed on the same resin substrate.
Figure 45:
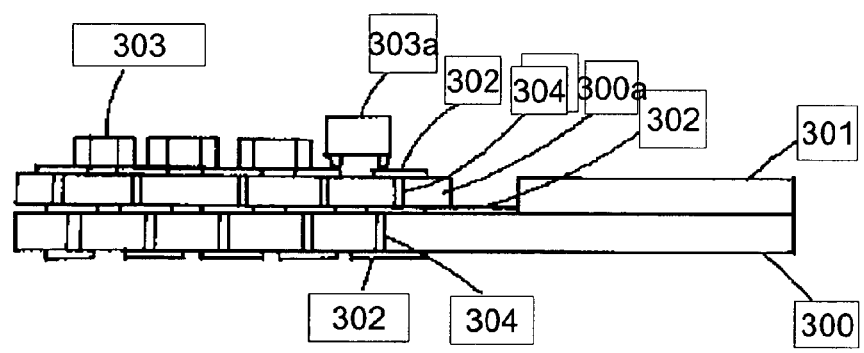
FIG. 45 is a cross sectional view illustrating the case where a conventional CCD image capturing element and a plurality of electronic parts are installed on the same resin substrate.
Figure 46:
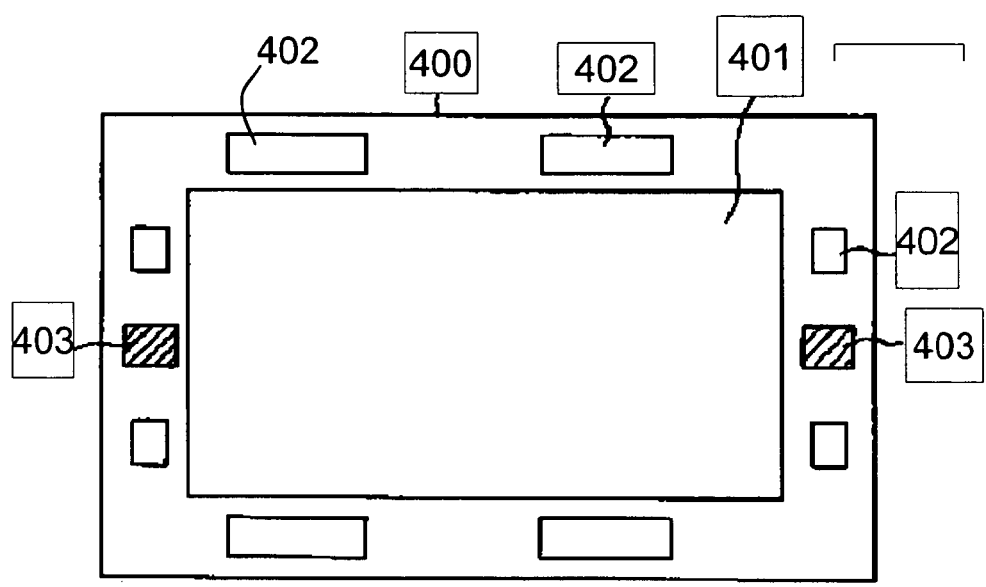
FIG. 46 is a plan view illustrating a conventional integrated structure of a display element and an image capturing element, which is disclosed in Reference 2.

FIG. 42 is a block diagram schematically illustrating an exemplary configuration of an electronic information device as Embodiment 4 of the present invention, using the display element and image capturing element modules according to Embodiments 1 to 3 of the present invention in a display section and an image capturing section thereof.

In FIG. 42, an electronic information device 90 according to Embodiment 4 of the present invention includes: a solid-state image capturing apparatus 91 for performing various signal processing on an image capturing signal from any of the image capturing modules 20A to 20D of the display element and image capturing element modules according to Embodiments 1 to 3 so as to obtain a color image signal; a memory section 92 (e.g., recording media) for data-recording a color image signal from the solid-state image capturing apparatus 91 after a predetermined signal process is performed on the color image signal for recording; a display section 93 (e.g., a liquid crystal display apparatus) for displaying the color image signal from the solid-state image capturing apparatus 91 on a liquid crystal display screen of the display element 2 after predetermined signal processing is performed on the color image signal for display; a communication section 94 (e.g., a transmitting and receiving device) for communicating the color image signal from the solid-state image capturing apparatus 91 after predetermined signal processing is performed on the color image signal for communication; and an image output section 95 (e.g., a printer) for printing the color image signal from the solid-state image capturing apparatus 91 after predetermined signal processing is performed for printing. Without any limitations to this, the electronic information device 90 may include at least any of the memory section 92, the display section 93, the communication section 94, and the image output section 95, such as a printer. Of course, it is possible to display the color image signal, which is received at the communication section 94, on a display screen of the display element 2 (e.g., a liquid crystal display apparatus) after predetermined signal processing is performed on the color image signal for display.

As the electronic information device 90, an electronic device that includes an image input device is conceivable as described previously, such as a digital camera (e.g., digital video camera and digital still camera), an image input camera (e.g., a monitoring camera, a door phone camera, a camera equipped in a vehicle for monitoring the front (drive recorder), and a television telephone camera), a scanner, a facsimile machine, a camera-equipped cell phone device, and a personal digital assistant (PDA).

According to Embodiment 4, therefore, the color image signal from the solid-state image capturing apparatus 91 can be: displayed on a display screen properly, printed out on a sheet of paper using an image output section 95, communicated properly as communication data via a wire or a radio, stored properly at the memory section 92 by performing predetermined data compression processing; and various data processes can be properly performed.

Without the limitation to the electronic information device 90 of Embodiment 4 described above, an electronic information device having the display element·image capturing element module of the present invention used in an information recording and reproducing section thereof may be included. The optical element of the electronic information device in this case is an optical function element (e.g., hologram optical element) for outputting output light in a straight line and for bending incident light to be entered in a predetermined direction. In addition, the electronic element of the electronic information device includes therein a light emitting element (e.g., a semiconductor laser element or a laser chip) for generating output light, and a light receiving element (e.g., a photo IC) for receiving incident light.

As described above, the present invention is exemplified by the use of its preferred Embodiments 1 to 4. However, the present invention should not be interpreted solely based on Embodiments 1 to 4 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 4 of the present invention. Furthermore, it is understood that any patent, any patent application and any references cited in the present specification should be incorporated by reference in the present specification in the same manner as the contents are specifically described therein.

Industrial Applicability

The present invention can be applied in the field of a display element·electronic element module, such as a display module with an integrated light receiving element, in which an image capturing element is integrated with a glass substrate functioning as a transparent support substrate having a display element disposed thereon, the image capturing element being configured with a semiconductor element for performing a photoelectric conversion on and capturing an image from an image light from a subject; and a method for manufacturing the display element·electronic element module. Furthermore, the present invention relates to an electronic information device, such as a digital camera (e.g., a digital video camera and a digital still camera), an image input camera, a scanner, a facsimile machine, and a camera-equipped cell phone device, a television telephone device, and a display module equipped with a television set and a display unit or a display apparatus for displaying information, having the display element·electronic element module used in a display section and a light receiving section thereof. According to the present invention, an image capturing element and further a lens are integrated with a glass substrate having a display element disposed thereon, so that it becomes further possible to achieve a reduction of the number of parts, a reduction of the installing area, downsizing and thinning of the terminal by the improvement of the wiring efficiency, and lowering of the power consumption.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A display element and electronic element module, in which a part of a translucent support substrate is formed as a lens,
    the substrate having a display disposed thereon, the lens being formed on a part other than where the display is disposed, wherein an electronic element is disposed for the lens,
        wherein shielding layers are provided proximal to an outer circumference side of the lens formed on the translucent support substrate,
        wherein in each shielding layer, a groove formed on the translucent support substrate is filled with a shielding material, and
        wherein the shielding layers comprise a first shielding layer formed in a first groove being formed within the lens, the first groove being formed both proximal to the outer circumference side of the lens and from a first surface side of the translucent support substrate, and a second shielding layer formed in a second groove formed within the lens, the second groove formed both proximal to the first shielding layer and from a second surface side of the translucent support substrate which is opposite to the first surface side.

2. A display element and electronic element module according to claim 1, wherein a shielding film is provided on the translucent support substrate surrounded by the shielding layer, except for on a middle portion for receiving incident light for the lens.

3. A display element and electronic element module according to claim 1, wherein the shielding layer is a plurality of grooves formed in the translucent support substrate, filled with shielding material, the plurality of grooves being formed double or triple in a circular, ellipse or quadrilateral shape in plan view.

4. A display element and electronic element module according to claim 2, wherein a metal film for wiring is provided on a metal film for shielding a light with an insulation film interposed therebetween, and each terminal section of the electronic element is connected to a wiring layer in which the metal film for wiring is patterned.

5. A display element and electronic element module according to claim 1, wherein a space between the electronic element and the translucent support substrate is sealed with a shielding material.

6. A display element and electronic element module according to claim 1, wherein, in order to directly display an image on the display based on image data from an image capturing element as the electronic element, a wiring path is provided, in which the display is connected with the image capturing element by a wiring pattern of a metal film on the translucent support substrate.

7. A display element and electronic element module according to claim 1, wherein an IR cut material is provided between the lens and a light receiving area of a light receiving element as the electronic element.

8. A display element and electronic element module according to claim 7, wherein the IR cut material is provided on any of: a curved surface of the lens, a surface of a translucent support substrate surface opposite from a side on which the curved surface of the lens is formed, and a surface of the light receiving area of the light receiving element.

9. A display element and electronic element module according to claim 1, wherein the lens of the translucent support substrate is either a concave lens or a convex lens.

10. A display element and electronic element module according to claim 1, wherein one or a plurality of electrode sections are disposed in a peripheral area surrounding an element area in the electronic element, and a connection configuration, in which the electronic element is connected to a wiring section of the translucent support substrate configuring a display by a conductive protrusion on the electrode section, includes a packaging configuration, in which at least the connection configuration is bonded with a resin between the translucent support substrate and the electronic element in such a manner to avoid an area corresponding to the element area between the translucent support substrate and the electronic element.

11. A display element and electronic element module according to claim 10, wherein a connection section, in which conductive particles of an anisotropy conductive resin material are interposed between the wiring section of the translucent support substrate and the conductive protrusion of the electrode section, is bonded with the resin in such a manner to completely cover the connection section.

12. A display element and electronic element module according to claim 10, wherein the peripheral area including the connection configuration between the translucent support substrate and the electronic element is bonded with the resin.

13. A display element and electronic element module according to claim 10, wherein a protruded step section for preventing the resin from spreading into an area corresponding to the element area is provided in at least either the peripheral area of the electronic element or an area of the translucent support substrate facing the peripheral area.

14. A display element and electronic element module according to claim 10, wherein a protruded step section for preventing the resin from spreading outside is provided in at least either a peripheral section of the electronic element or a peripheral section of the area facing the electronic element on the translucent support substrate.

15. A display element and electronic element module according to claim 10, wherein a material layer having a characteristic of repelling the resin is provided in at least either the peripheral area of the electronic element or an area of the translucent support substrate facing the peripheral area, to prevent the resin from spreading in the area corresponding to the element area.

16. A display element and electronic element module according to claim 10, wherein a material having a characteristic of repelling the resin is provided in at least either the peripheral area of the electronic element or a peripheral section of an area on the translucent support substrate facing the electronic element, to prevent the resin from spreading outside.

17. A display element and electronic element module according to claim 14, wherein the peripheral section of the electronic element is an end section of the electronic element and the periphery of the exterior side.

18. A display element and electronic element module according to claim 16, wherein the peripheral section of the electronic element is an end section of the electronic element and the periphery of the exterior side.

19. The display element and electronic element module according to claim 18, wherein a sealing resin is provided further at a peripheral section of the periphery of the exterior side, and the sealing resin seals a space between the translucent support substrate and the electronic element.

20. A display element and electronic element module according to claim 17, wherein a sealing resin is provided further at a peripheral section of the periphery of the exterior side, and the sealing resin seals a space between the translucent support substrate and the electronic element.

21. A display element and electronic element module according to claim 20, wherein the sealing resin covers a side surface and an upper surface of the electronic element.

22. A display element and electronic element module according to claim 19, wherein the sealing resin covers a side surface and an upper surface of the electronic element.

23. A display element and electronic element module according to claim 13, wherein at least a surface section of the protruded step is formed of a material having a characteristic of repelling the resin.

24. A display element and electronic element module according to claim 14, wherein at least a surface section of the protruded step is formed of a material having a characteristic of repelling the resin.

25. A display element and electronic element module according to claim 10, wherein, as the resin, a resin including conductive particles is provided at least at a connection section of the connecting configuration.

26. A display element and electronic element module according to claim 10, wherein the resin material includes conductive particles and is an anisotropy conductive resin material.

27. A display element and electronic element module according to claim 10, wherein the resin at least partially includes a resin including non-conductive particles.

28. A display element and electronic element module according to claim 10, wherein the resin at least partially includes a light shielding resin.

29. A display element and electronic element module according to claim 13, wherein the step section is formed of a common material for forming the display.

30. A display element and electronic element module according to claim 14, wherein the step section is formed of a common material for forming the display.

31. A display element and electronic element module according to claim 23, wherein the partial repelling the resin is formed of a common material for forming the display.

32. A display element and electronic element module according to claim 24, wherein the material repelling the resin is formed of a common material for forming the display.

33. A display element and electronic element module according to claim 15, wherein the material repelling the resin is formed of a common material for forming the display.

34. A display element and electronic element module according to claim 16, wherein the material repelling the resin is formed of a common material for forming the display.

35. A display element and electronic element module according to claim 13, wherein the step section is formed of a common material for forming a film on the electronic element.

36. A display element and electronic element module according to claim 13, wherein the step section is formed of a common material for forming a film on an electronic element.

37. A display element and electronic element module according to claim 14, wherein the step section is formed of a common material for forming a film on an electronic element.

38. A display element and electronic element module according to claim 13, wherein the step section is formed of a material that cures by electromagnetic waves.

39. A display element and electronic element module according to claim 14, wherein the step section is formed of a material that cures by electromagnetic waves.

40. A display element and electronic element module according to claim 10, wherein the translucent purport substrate includes wirings on both surfaces, which are connected by a through hole and/or a side surface wiring.

41. A display element and electronic element module according to claim 39, wherein the electronic element is disposed on a surface opposite from a surface, on which the display is disposed, of the translucent support substrate, and the display and electronic element area are electronically connected with each other by the wirings on both surfaces.

42. A display element and electronic element module according to claim 1, wherein the electronic element is a light receiving element.

43. A display element and electronic element module according to claim 1, wherein the electronic element is an image capturing element including a plurality of light receiving sections provided therein for performing a photoelectric conversion on incident light to capture an image.

44. A display element and electronic element module according to claim 1, wherein the translucent support substrate is either a glass substrate or a resin substrate.

45. A method for manufacturing the display element and electronic element module according to claim 1, the method comprising:
   a lens forming step for forming the lens on a part of the translucent support substrate having the display disposed thereon, the lens being formed on a part other than wheel the display is disposed; and
   an electronic element disposing step of disposing the electronic element for the lens.

46. A method for manufacturing the display element and electronic element module according to claim 44, wherein in the lens forming step, a resist film surface shape obtained by heat-treating a patterned resist film is either transferred to the translucent support substrate by etching, or pressed on the translucent support substrate by a high pressure stamper, to form the lens surface.

47. A method for manufacturing the display element and electronic element module according to claim 44, wherein, in the lens forming step, one or a plurality of lenses are fixed in such a manner to conespond to the lens formed from the translucent support substrate, the one or a plurality of lenses being maintained in a holder.

48. An electronic information device including the display element and electronic element module according to claim 1 used in a display section and an image capturing section thereof.

49. An electronic information device including the display element and electronic element module of claim 1 used in a display section, a light emitting section and a light receiving section thereof.

* * * * *